(12) United States Patent
Nakamura et al.

(10) Patent No.: US 6,882,544 B2
(45) Date of Patent: Apr. 19, 2005

(54) PRINTED CIRCUIT BOARD, METHOD FOR PRODUCING SAME AND SEMICONDUCTOR DEVICE

(75) Inventors: Hirofumi Nakamura, Tokyo (JP); Satoshi Arai, Miyagi (JP)

(73) Assignees: NEC Toppan Circuit Solutions, Inc., Tokyo (JP); NEC Tokin Corporation, Sendai (JP)

( * ) Notice: Subject to any disclaimer, the term of this patent is extended or adjusted under 35 U.S.C. 154(b) by 112 days.

(21) Appl. No.: 10/602,828

(22) Filed: Jun. 25, 2003

(65) Prior Publication Data

US 2004/0246690 A1 Dec. 9, 2004

(30) Foreign Application Priority Data

Jun. 26, 2002 (JP) ........................................ 2002-185819

(51) Int. Cl.[7] .................................................. H05K 1/18
(52) U.S. Cl. ........................ 361/765; 361/766; 174/260; 428/209
(58) Field of Search ........................ 361/306.3, 760–766, 361/792–795; 174/258–264; 428/209–210; 29/830–832

(56) References Cited

U.S. PATENT DOCUMENTS 5,745,984 A * 5/1998 Cole et al. .................... 29/834
6,724,638 B1 * 4/2004 Inagaki et al. ............... 361/763
6,749,927 B1 * 6/2004 Cooray ........................ 428/209
6,803,324 B1 * 10/2004 Ogawa et al. ............... 438/761

FOREIGN PATENT DOCUMENTS

| JP | 07-094368 | 4/1995 |
| JP | 2738590 | 1/1998 |
| JP | 2001-320171 | 11/2001 |

* cited by examiner

*Primary Examiner*—Kamand Cuneo
*Assistant Examiner*—Tuan Dinh
(74) *Attorney, Agent, or Firm*—McGinn & Gibb, PLLC

(57) ABSTRACT

A thin type printed circuit board with an enclosed capacitor of a large capacitance. The printed circuit board includes metal sheet 11 having roughed surface presenting micro-irregularities, a dielectric film for capacitor 12 covering the surface of the metal sheet, and a first electrically conductive layer of electrically conductive resin 13 covering the surface of the dielectric film. A second electrically conductive layer 14 is provided on the surface of the first electrically conductive layer in a region of via for cathode side connection 18. The metal sheet and the first and second electrically conductive layers are encapsulated by resin 15. The via for cathode side connection 18, obtained on boring through the resin 15 until reaching the second electrically conductive layer 14, is coated with an electrode 20. A via for anode side connection 19 obtained on boring through the resin 15 is coated with an electrode 21 that is insulated from the second electrically conductive layer 13 by the resin 15.

42 Claims, 14 Drawing Sheets

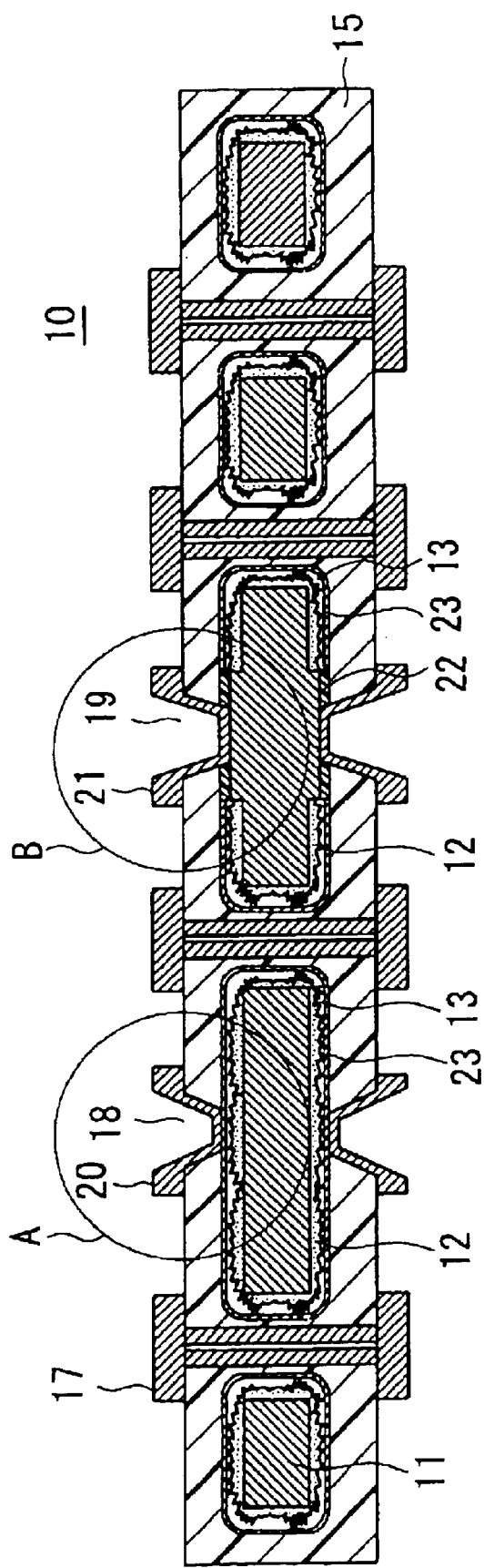

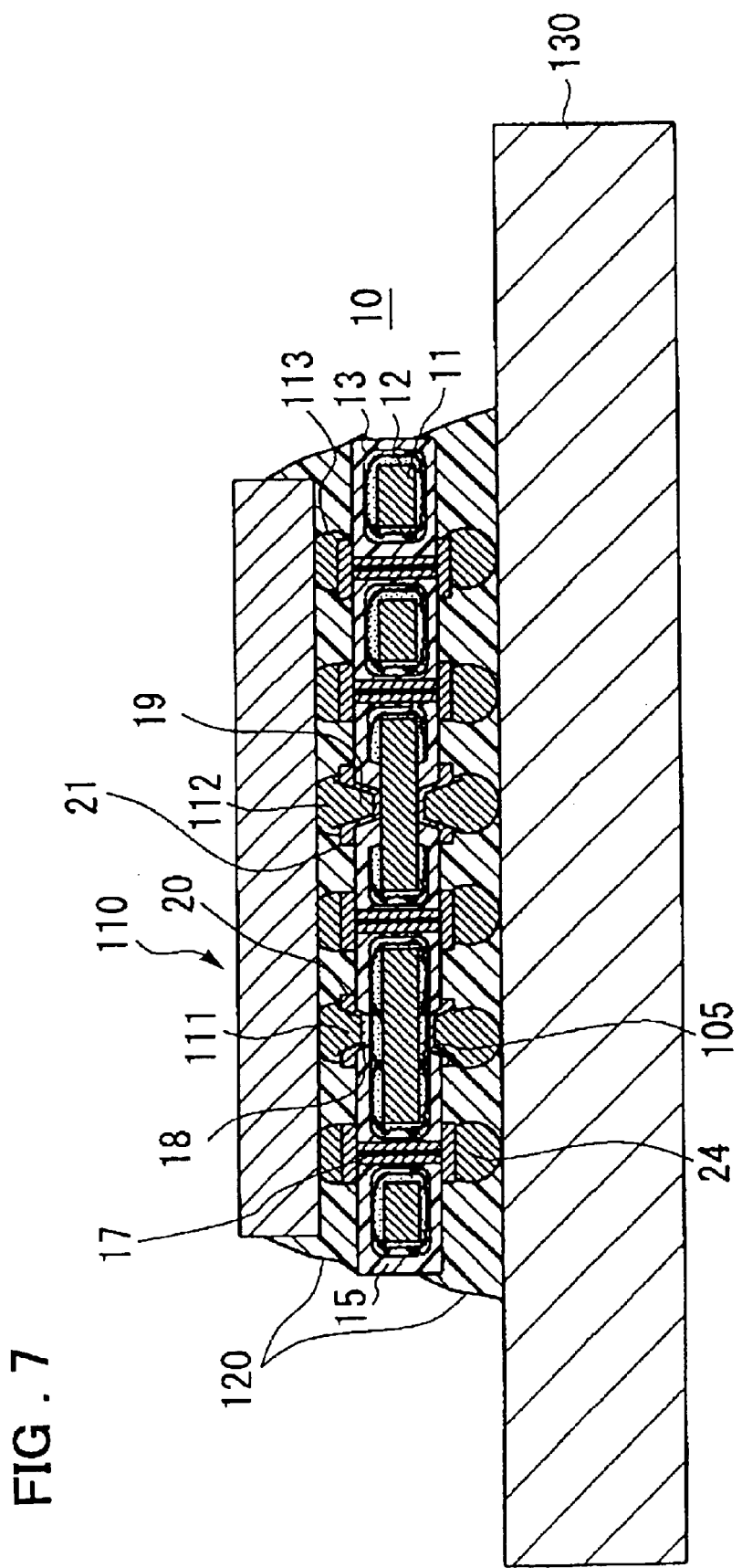

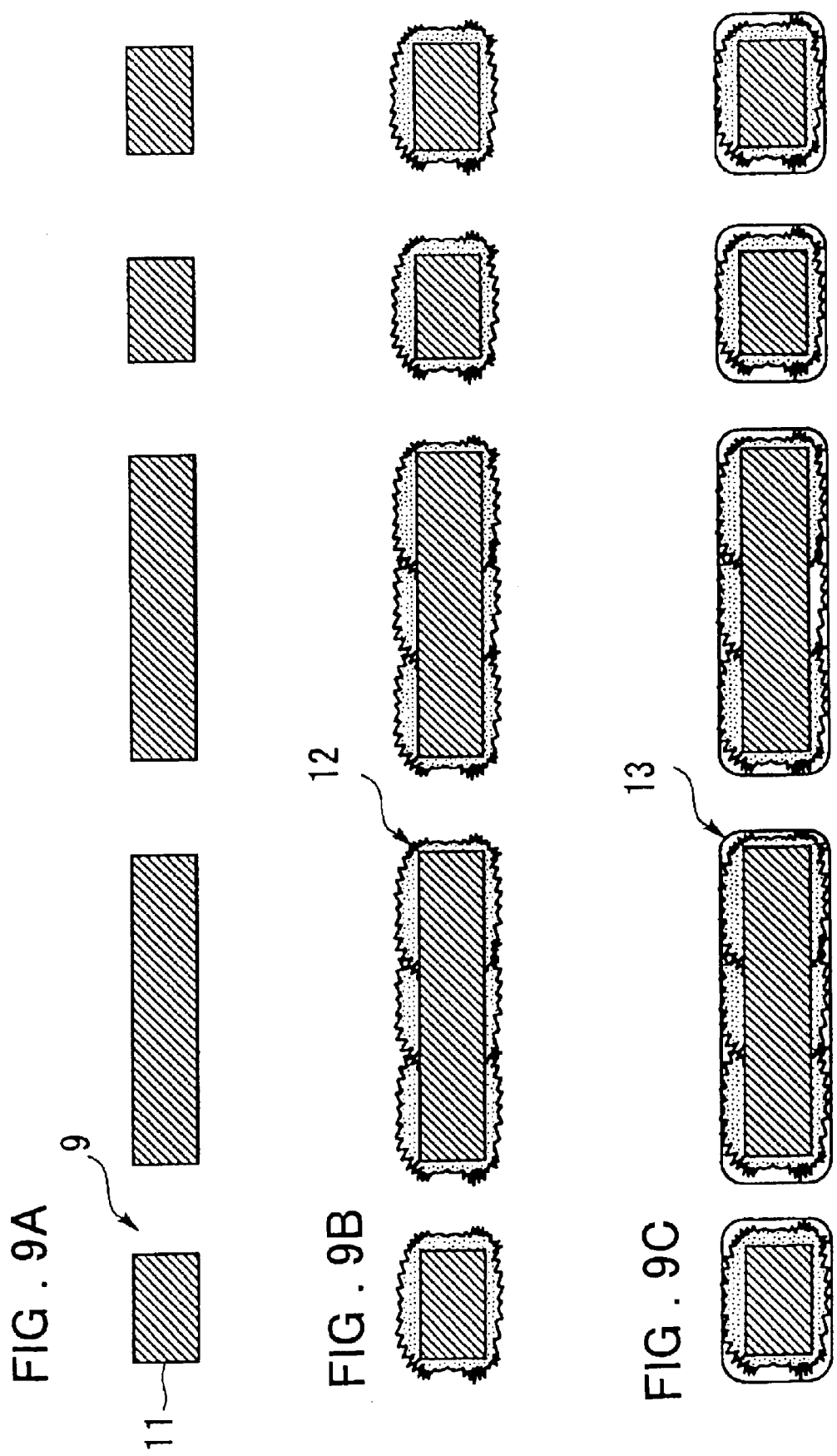

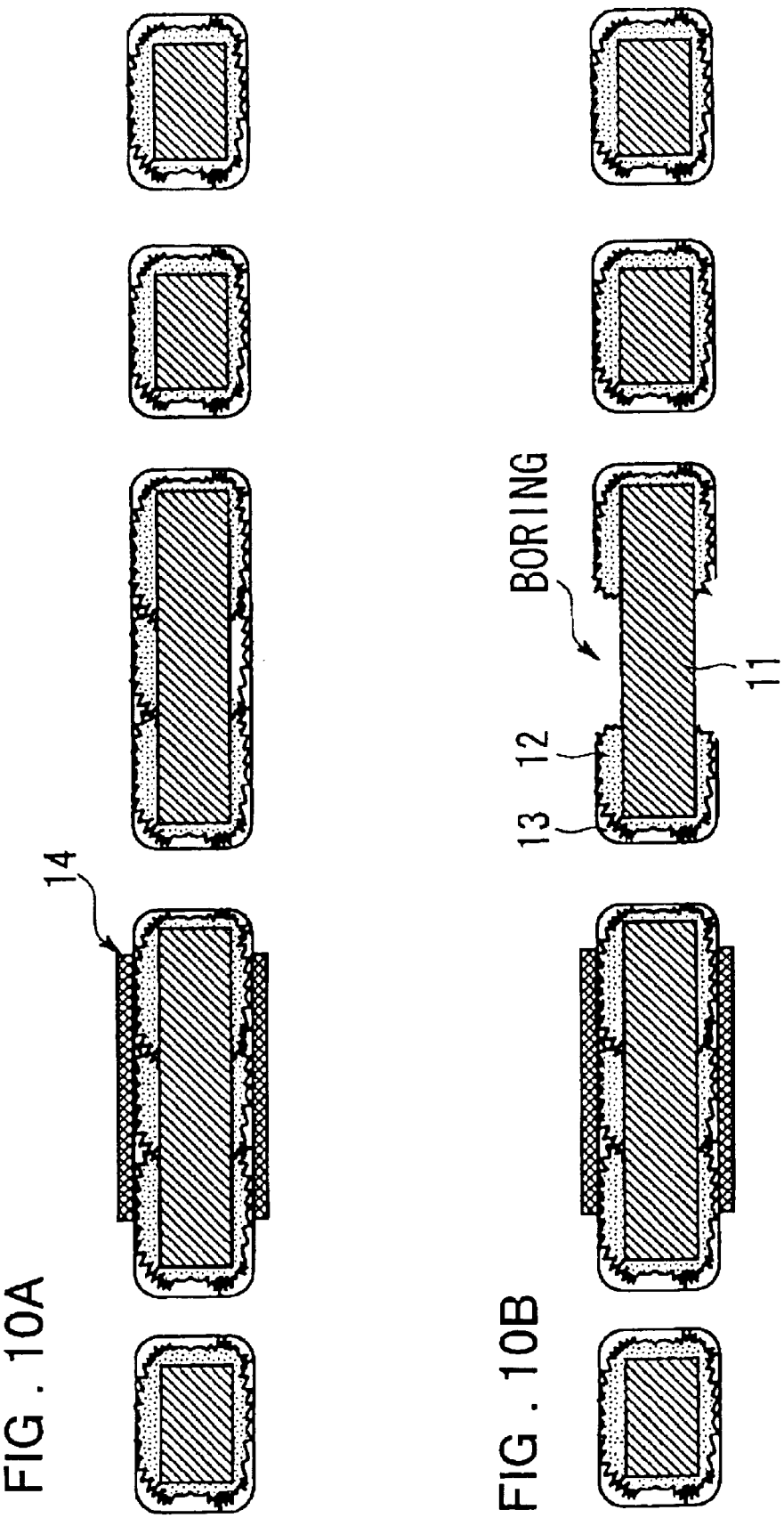

PRINTED CIRCUIT BOARD, METHOD FOR PRODUCING SAME AND SEMICONDUCTOR DEVICE

FIELD OF THE INVENTION

This invention relates to a printed circuit board and, more particularly, to a printed circuit board having a capacitor structure, a method for producing the same, and to a semiconductor device.

BACKGROUND OF THE INVENTION

In connection with a conventional printed circuit board, having a capacitor buried in a substrate thereof, reference is had to, for example, the following publications:

(1) Publication of JP Patent No. 2738590, and (2) Publication of JP Patent Kokai JP-P2001-320171A.

Of these, the publication (1) (Publication of JP Patent No. 2738590) discloses a capacitive printed circuit board including a capacitor laminate and a plural number of devices respectively connected to different portions of the capacitor laminate, in which the capacitor laminate is made up by laminated dielectric sheets and two electrically conductive foils, arranged on both sides of the laminated dielectric sheets, and having a first surface surface-processed to present a surface roughness sufficient to exhibit adhesion to the laminated dielectric sheets, in which the second surface of each electrically conductive foil opposite to the first surface is surface-processed to present a surface roughness to exhibit adhesion within the capacitive printed circuit board, in which the capacitor laminate is made up by one dielectric sheet and two electrically conductive foils, as the first surface of said electrically conductive foil is tightly contacted with the dielectric sheet and in which the dielectric sheet is of the minimum thickness in all portions thereof facing the electrically conductive foil. Specifically, the above Publication 1 discloses a structure of a capacitor laminate in which electrically conductive layers are arranged on both sides of an organic dielectric layer to operate as a capacitor. However, with this structure, the capacitance cannot exceed the limit of approximately several nF at most.

In a well-known manner, there are three techniques for increasing the capacitance C of a capacitor, that is increasing the surface area of an electrode;

reducing the separation between the electrodes (or reducing the thickness of the dielectric layer between the electrodes); and increasing the dielectric constant of the dielectric layer.

However, in light of product reliability, such as electrical insulating properties, or manufacture process, it is difficult to reduce the film thickness of the dielectric layer to 1 μm or less. It is similarly difficult to increase the dielectric constant of the dielectric layer drastically.

For increasing the surface area of the electrically conductive layer of the facing capacitive electrodes, the metal surface is roughed to apparently increase the surface area, as described in Publication 1. However, with the technique described in Publication 1, the surface area of the facing electrode surfaces cannot be actually increased, and hence a sufficient performance cannot be achieved.

There is also a method of burying a component, operating as a capacitor, in the bulk of the printed circuit board. However, the buried type capacitive component prescribes the substrate thickness or the electrode contact site and thus imposes constraint on the degree of freedom in substrate designing.

The second Publication (Publication of JP Patent Kokai JP-P2001-320171A) discloses a structure comprising a dielectric layer for a capacitor, formed of aluminum oxide, which covers the surface of the aluminum substrate, and a plating layer for a capacitor electrode, which is formed to cover the surface of the dielectric layer for the capacitor. The aluminum substrate, the dielectric layer for the capacitor and the plating layer for the capacitor electrode go to make up a capacitor in a multi-layered circuit substrate to eliminate the necessity of embedding a chip capacitor in an inter-layer insulating film to reduce the thickness of the inter-layer insulating film thereby reducing the thickness of the multi-layered circuit substrate in its entirety. This Publication (2) indicates that a dielectric film for a capacitor of $Al_2O_3$ may be formed by oxidizing the surface of the aluminum substrate with oxygen plasma to form a dielectric film for the capacitor of $Al_2O_3$ as a surface layer or to deposit powders of $Al_2O_3$ on the surface of an aluminum substrate formed by sintering. However, the aluminum oxide film, formed by, for example, sintering of the powders, is not up to the requirement for a reduced thickness.

SUMMARY OF THE DISCLOSURE

In the structure of layering the dielectric sheet, disclosed in Publication 1, the thickness of the dielectric sheet cannot exceed several μm by physical limitation, so that a capacitance as large as tens of μF cannot be realized. Moreover, in the structure shown in Publication 1, the dielectric sheet is sandwiched between electrically conductive foils having roughed surfaces. That is, the surfaces of the both side electrically conductive foils are merely roughed without substantially increasing the surface area of the electrodes. Specifically, the effect of increasing the surfaces of the opposing electrodes cannot be achieved.

The structure of Publication 2 also is not up to the requirement for reduction in the film thickness.

In view of the above-depicted status of the art, it is an object of the present invention to provide a printed circuit board capable of accumulating a large amount of electrical charges, a method for producing the printed circuit board, and a semiconductor device provided with the printed circuit board.

According to one aspect of the present invention there is provided a printed circuit board comprising a metal sheet having a surface partially or totally roughed, a dielectric film for a capacitor covering at least the roughed surface of the metal sheet, a first electrically conductive layer covering the surface of the dielectric film for the capacitor, a second electrically conductive layer formed on the surface of the first electrically conductive layer and electrically connected to an electrode of a first via for electrical connection to the first electrically conductive layer, and a resin layer provided for encapsulating an assembly made up by the metal sheet, dielectric film for the capacitor, the first electrically conductive layer and the second electrically conductive layer. The first via for connection is formed on boring through the resin layer until reaching the second electrically conductive layer, the first via for connection including a first electrode of a conductive member deposited therein, while the second via for electrical connection to the metal sheet is not provided with the dielectric film for the capacitor, nor with the first electrically conductive layer, nor with the second electrically conductive layer on the metal sheet in the second via for electrical connection to the metal sheet. The second via for connection is formed extending throughout the resin layer until reaching the metal sheet. The second via for connection includes a second electrode of an electrically conductive member therein. The second electrode is electrically insulated from the first electrically conductive layer by an insulating member provided between the second electrode and the first electrically conductive layer.

In the printed circuit board according to the present invention, the dielectric film for the capacitor is formed of a film of a metal oxide.

In the printed circuit board according to the present invention, the first electrically conductive layer is formed of an electrically conductive resin which forms a solid electrolyte of a cathode. In the printed circuit board according to the present invention, the electrically conductive resin is preferably at least one electrically conductive high molecular compound selected from the group consisting of polypyrrole, polythiophene and polyaniline.

In the printed circuit board according to the present invention, the second electrically conductive layer is of a double-layer structure comprised of a carbon paste layer and a silver paste layer. Alternatively, the second electrically conductive layer in the printed circuit board according to the present invention may be formed of a metal plating layer.

In the printed circuit board according to the present invention, the insulating member may be formed of a resin encapsulating the metal sheet, a dielectric film for the capacitor, a first electrically conductive layer and a second electrically conductive layer, or may be provided different from the encapsulating resin.

In another aspect, the present invention provides a semiconductor device comprising a semiconductor chip and the printed circuit board in one aspect of the present invention, wherein the printed circuit board includes a through-hole extending from one surface to the opposite side surface of the printed circuit board, the through-hole including a conductor formed on an inner wall surface thereof. The first and second electrodes, provided in respective vias for connection on one surface of the printed circuit board, are connected to first and second power supply terminals of the semiconductor chip, and signal electrodes of the one surface of the printed circuit board are connected to associated electrodes of the semiconductor chip. The other surface of the printed circuit board includes an electrode connected to the electrodes on the one surface by the through-hole and the first and second electrodes provided in the respective vias for connection. The semiconductor device is connected to a mounting circuit substrate on the opposite surface of the printed circuit board.

In a further aspect of the present invention, there is provided a method for producing a printed circuit board. The method comprises various steps as follows:

(a) a step of roughing the surface of a metal sheet which is to be a core substrate;
(b) a step of forming a dielectric film of a capacitor on at least the roughed surface of the metal sheet;
(c) a step of forming a first electrically conductive layer on a dielectric film for a capacitor;
(d) a step of forming a second electrically conductive layer in an area on the surface of the first electrically conductive layer in register with an area in which a first via for electrical connection to the first electrically conductive layer is to be formed;
(e) a step of boring a hole through the first electrically conductive layer and the dielectric film of the capacitor in an area in which a second via for electrical connection to the metal sheet is to be formed to remove the first electrically conductive layer and the dielectric film of the capacitor to expose the metal sheet;
(f) a step of encapsulating an assembly including the metal sheet, said first electrically conductive layer, said dielectric film for the capacitor and the second electrically conductive layer, formed by the respective steps, with an electrically insulating resin;
(g) a step of boring through the resin in the first via for connection to expose the second electrically conductive layer and boring through the resin in the second via for connection to expose the metal sheet; and
(h) a step of depositing an electrically conductive material in a conductor pattern including the vias and in a through-hole.

A method for producing a printed circuit board in another aspect of the invention comprises (a) a step of forming an insulating member in a partial area on the surface of a metal sheet, as a core substrate, where electrical connection to the metal sheet is to be established;
(b) a step of roughing the surface of the metal sheet as a partial area of the metal sheet is covered by the insulating member;
(c) a step of forming a dielectric film for a capacitor on the roughed surface of the metal sheet except an area thereof covered by the insulating member, while the insulating member is left on the metal sheet;
(d) a step of forming a first electrically conductive layer on the dielectric film for the capacitor while the insulating member is left on the metal sheet;
(e) a step of forming a second electrically conductive layer in an area of the surface of said first electrically conductive layer in which a first via for electrical connection to said first electrically conductive layer is to be formed, while said insulating member is left on said metal sheet;
(f) a step of encapsulating an assembly including the metal sheet, said first electrically conductive layer, said dielectric film for the capacitor and the second electrically conductive layer, with the insulating member, formed by the respective steps, with an electrically insulating resin;
(g) a step of boring in the resin in the first via for connection to expose the second electrically conductive layer and boring in the resin and the insulating member in the second via for electrical connection to the metal sheet, to expose a portion of the surface of the metal sheet; and
(h) a step of depositing an electrically conductive material in a conductor pattern including the vias.

As may be seen from the foregoing explanation, the above object may similarly be accomplished by the claims and sub-claims.

BRIEF DESCRIPTION OF THE DRAWINGS

FIG. 5 is a cross-sectional view showing the structure of a third embodiment of the present invention.

FIG. 7 is a cross-sectional view showing the structure of a fourth embodiment of the present invention.

FIGS. 9A, 9B and 9C are cross-sectional views showing the manufacturing method of the first embodiment of the present invention, step-by-step.

FIGS. 10A and 10B are cross-sectional views showing the manufacturing method of the first embodiment of the present invention, step-by-step.

PREFERRED EMBODIMENTS OF THE INVENTION

Figure 1:
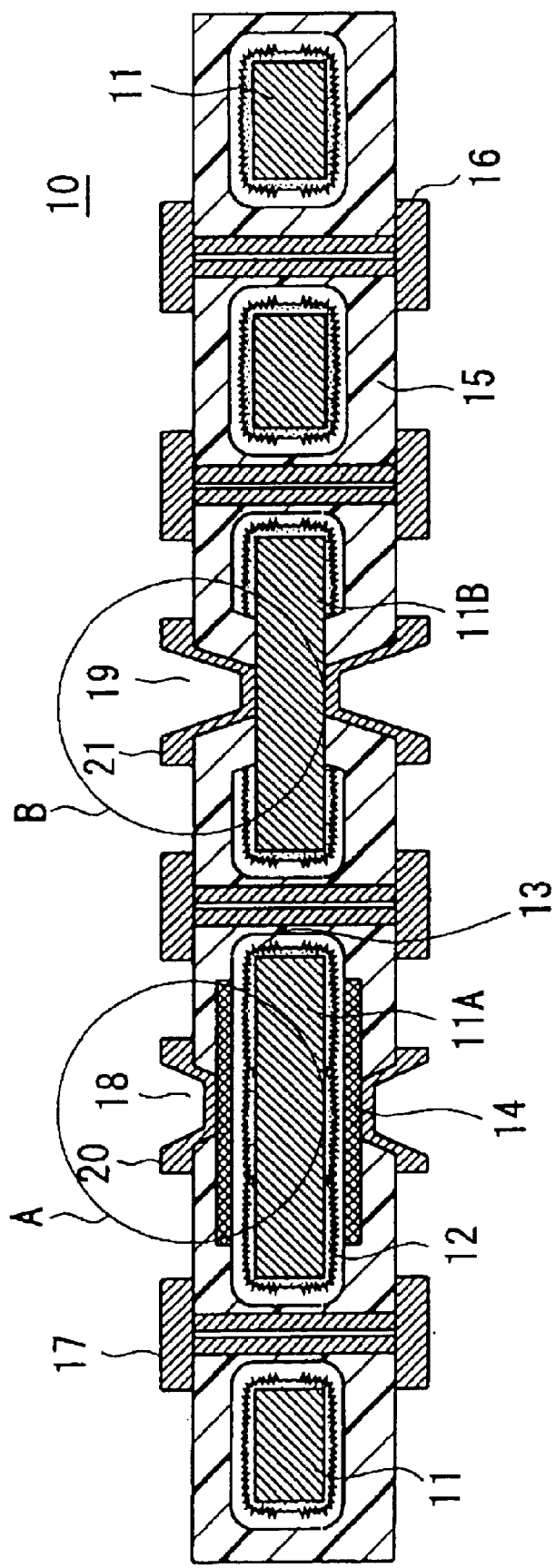
FIG. 1 is a cross-sectional view showing the structure of a first embodiment of the present invention at a typical cross section.

Now, certain embodiments of the present invention are hereinafter explained. The reference symbols mentioned herein relate to help understanding and are not intended to restrict anyhow the invention to embodiments as illustrated in the figures.

An embodiment of the present invention includes a metal sheet (11), the surface of which is partially or totally roughed to present micro-irregularities, a dielectric film for a capacitor (12), formed for covering at least the roughed surface of the metal sheet (11), presenting micro-irregularities, and a first electrically conductive layer (13) formed for covering the roughed surface of the dielectric film for a capacitor (12), presenting micro-irregularities. The first electrically conductive layer (13) is formed of an electrically conductive high molecular (or polymer) layer which forms a solid electrolyte material of the cathode.

In the present embodiment, a second electrically conductive layer (14) is formed on the surface of the first electrically conductive layer (13) in the region of a via for cathode side connection (18) for establishing electrical connection of the first electrically conductive layer (13).

In the present embodiment, there is provided no dielectric film for the capacitor (12), nor the first electrically conductive layer (13), nor the second electrically conductive layer (14) on the metal sheet (11) in the region of the via for cathode side connection (19) for establishing electrical connection for the metal sheet (11).

In the present embodiment, an electrically insulating resin (also termed an inter-layer resin layer) (15) exemplified, e.g., by epoxy resin is provided for covering the metal sheet (11), dielectric film for a capacitor (12) and the first and second electrically conductive layers (13, 14).

In the present embodiment, the via for cathode side connection (18) includes an electrode (20) produced on depositing an electrically conductive member of, for example, copper, as by plating, in a via formed on boring through the resin (15) until the second electrically conductive layer (14) is reached. In a region surrounding the cathode side electrode (20), the bottom of the resin (15) abuts against (adheres to) the second electrically conductive layer (14). The anode side connection via (19), obtained on boring through the resin (15) until the surface of the metal sheet (11) is reached, is provided with an electrode (21) deposited in the via.

In the anode side connection via (19), in the present embodiment, the resin (15), charged into a space between the anode side electrode (21) and the first electrically conductive layer (13) in the vicinity of the anode side connection via (19) provides for electrical insulation between the anode side electrode (21) and the first electrically conductive layer (13) in the vicinity of the anode side connection via (19). The resin (15), having its bottom abutting against the metal sheet (11), surrounds a portion of the lateral surface of the anode side electrode (21).

In the present embodiment, the metal sheet (11), dielectric material for a capacitor (12) and the first electrically conductive layer (13) make up a capacitor device, while the first electrically conductive layer (13), the second electrically conductive layer (14) for electrode contact and the electrode (20) make up the cathode side electrode. The metal sheet (11) works as an anode, with the electrode (21) forming the anode side electrode.

In the present embodiment, the dielectric material for the capacitor (12) is a metal oxide film. The electrically conductive high molecular layer, forming the first electrically conductive layer (13), is formed of at least one of, for example, polypyrrole, polythiophene and polyaniline.

In the present embodiment, the second electrically conductive layer (14) is preferably of a dual film structure, e.g., composed of a carbon paste layer and a silver paste layer.

In another embodiment of the present invention, an insulating member (22), having one surface contacting with the metal sheet (11), is provided surrounding the electrode (21) on the surface of the metal sheet (11) in the anode side connection via (19). The surface of an insulating member (22) opposite to the one surface in an upstanding (vertical) direction normal to the surface of the metal plate (11) is flush with or at a higher position than the surface of the first electrically conductive layer (13), and abuts against the resin (15). The insulating member (22), surrounding a portion of the lateral surface of the anode side electrode (21), provides for electrical insulation between the anode side electrode (21) and the first electrically conductive layer (13) lying in the vicinity of the anode side connection via (19). Preferably, the insulating member (22) is formed of a resist, operating as a mask for roughing the surface of the metal plate (11), being left on the metal sheet (11).

In a further embodiment of the present invention, the second electrically conductive layer, interposed between the first electrically conductive layer (13) and the cathode side electrode (20), may be formed by a metal plating layer provided for covering the first electrically conductive layer (13). The metal plating layer (13) is formed of a metal, e.g., which is one of nickel, copper and indium or an alloy thereof.

The manufacturing method of the present invention comprises e.g., the following steps:

Step 1: The surface of the metal plate (11), as a core substrate, is roughed, and a bore or bores is/are formed in a needed location(s) of the metal plate (11).

Step 2: The dielectric film for a capacitor (12) is formed on the roughed surface of the metal sheet (11).

Step 3: The first electrically conductive layer (13) is formed on the dielectric film for the capacitor (12). The first electrically conductive layer (13) is made up by an electrically conductive high molecular layer formed a cathode side solid electrolyte material.

Step 4: The second electrically conductive layer (14) is formed in a region of the surface of the first electrically conductive layer (13) where a via for cathode side connection for establishing electrical connection to the first electrically conductive layer (13) is to be formed.

Step 5: A bore is formed through the regions of the first electrically conductive layer (13) and the dielectric film for the capacitor (12) where the via (19) for anode side connection for establishing the connection (contact) to the metal sheet (11) is to be formed, thereby exposing the metal sheet (11).

Step 6: The assembly including the metal sheet (11), dielectric film for the capacitor (12), first electrically conductive layer (13) and the second electrically conductive layer (14) is encapsulated by an electrically insulating resin (15).

Step 7: Bores are formed through the resin (15) to form the first and second vias for connection (18, 19). At this time, the resin (15) is removed as far as the upper surface of the second electrically conductive layer (14) in the first via for connection to expose the second electrically conductive layer (14). In the second via for connection (19), a bore is formed through the resin (15) until the metal sheet (11) is exposed.

Step 8: An electrically conductive material (16) is deposited in a conductor pattern including each via and in the through-hole.

The manufacturing method for a printed circuit board, according to a further embodiment of the present invention, comprises e.g., the following steps:

Step 1: An insulating member (22) is formed in a portion of the surface of the metal sheet (11) as a core substrate where electrical connection is to be established to the metal sheet.

Step 2: Under the condition that the surface of the metal sheet (11) is covered with the insulating member (22), the surface of the metal sheet (11) is roughed. The insulating member (22) operates as a mask for the roughing processing, such that the surface of the metal sheet (11) not covered by the insulating member (22) is roughed, while the surface of the metal sheet (11) covered by the insulating member (22) is not roughed.

Step 3: Leaving the insulating member (22) on the metal sheet (11), the dielectric film for the capacitor (12) is formed on the surface of the roughed metal sheet (11).

Step 4: Leaving insulating member (22) is left on the metal sheet (11), the first electrically conductive layer (13) is formed on the dielectric film for the capacitor (12). The first electrically conductive layer (13) is not formed on the insulating member (22).

Step 5: Leaving the insulating member (22) on the metal sheet (11), the second electrically conductive layer (14) is formed in an area of the surface of the first electrically conductive layer (13) where the first via for connection (18) for setting electrical connection to the first conductor layer is to be formed. The second electrically conductive layer (14) is not formed on the insulating member (22).

Step 6: The assembly including the metal sheet up to the second electrically conductive layer and the insulating member (22), formed by the above steps, is encapsulated by an electrically insulating resin (15).

Step 7: At the first via for connection (18), a bore is formed through the resin (15) to expose the second electrically conductive layer (14). At the second via for connection (19) for setting electrical connection to the metal sheet (11), a bore is formed through the resin (15) and the insulating member (22) to expose a portion of the surface of the metal sheet (11).

Step 8: An electrically conductive material is deposited according to a conductor pattern inclusive of each via.

In the above-described embodiment of the further embodiment of the present invention, the insulating member (22), which is to become a mask for the roughing processing, is pre-formed in a region of the surface of the metal sheet (11) in which the via for anode side connection is to be formed. In the roughing processing, the region covered by the insulating member (22) is not roughed, while neither the dielectric film for the capacitor (12) nor the first electrically conductive layer (13) is formed in this region. As a consequence, only one boring step by e.g., laser working in the above step 7 would suffice for forming the via for anode side connection, thus simplifying the manufacturing process for the printed circuit board of the buried capacitor type, insofar as the boring process is concerned.

In a method of a still further embodiment of the present invention, the second electrically conductive layer (23) comprised of a metal plating is formed in step 5 to overlie the first electrically conductive layer (13) except the area of the insulating member (22). In step 7, a bore is formed through the resin (15) to form the via for cathode side connection and the via for anode side connection, respectively. In the via for cathode side connection, the resin (15) is removed as far as the upper surface of the second electrically conductive layer (23) is exposed. In the via for anode side connection, a bore is formed through the resin (15) and the insulating member (22) until the metal sheet (11) is exposed.

Preferred Embodiments

For more detailed description of the above-described embodiments of the present invention, the embodiments of the present invention are now explained with reference to the drawings. FIGS. 1 and 2 illustrate the structure of a first embodiment of the present invention.

An aluminum sheet (Al sheet) 11, forming a metal core substrate of the printed circuit board, has a roughed surface. Specifically, micro-irregularities are formed on the surface of the foil-shaped aluminum sheet 11 by e.g., etching. By employing a metal sheet, e.g., aluminum sheet 11 as a core substrate, it is possible to reduce the substrate thickness and yet to provide for the required strength.

On the surface of the aluminum sheet 11, an aluminum oxide (Al oxide) layer 12, as a dielectric film for a capacitor, is formed to a thickness having e.g., hundreds of picometers (pm), where 1 pm is $10^{-12}$ m, as a lower limit and having e.g., tens of nanometers (nm) as an upper limit. The thin film of the aluminum oxide layer 12 may be formed by any suitable film-forming method, such as a sputtering method. Thus, in the present embodiment, an oxide film, formed by the aluminum oxide layer 12, having a high dielectric constant, is formed on the aluminum sheet 11, having a surface area increased by the roughing processing, whereby the capacitance of the capacitor is increased by reduction in the capacitor thickness and the enlarged electrode surface area.

On the surface of the aluminum oxide layer 12, there is formed, as a counter-electrode, a solid electrolyte layer, such as a layer of an electrically conductive high molecular material (e.g., polymer) 13. The thin film of the aluminum oxide layer 12 is coated by a solid electrolyte material, such as by the layer of an electrically conductive high molecular material 13, to provide for insulating properties. The layer of the electrically conductive high molecular material 13 is formed of, for example, polypyrrole, which is a polymeric pyrrole layer or the like. As disclosed in for example the Publication of the JP Patent Kokai JP-A-7-94368, such a solid electrolyte capacitor has been developed in which an electrically conductive high molecular compound, exhibiting electrical conductivity by doping a high molecular compound, having a conjugate system, such as polypyrrole, with a compound exhibiting electron donating or electron attracting properties, is used as a solid electrolyte material for a cathode. In the solid electrolyte capacitor, a layer of an electrically conductive chemical oxidation polymerization high molecular compound of polypyrrole, a graphite layer and a silver paste layer are formed on the surface of the dielectric oxide film in this order. In the present embodiment, the layer of an electrically conductive high molecular material 13 may be formed by e.g., polythiophene or polyaniline, etc. in place of polypyrrole.

In the layer of an electrically conductive high molecular material 13, an electrically conductive paste 14 is formed as an electrically conductive electrode contact layer in a location of connection by a connection via (contact via) for the anode. This electrically conductive paste 14 is of a dual layer structure comprised of a silver paste layer deposited on a carbon paste layer.

These layers are encapsulated (sealed-in/sandwitched) by an insulating resin 15, such as epoxy resin. A through-hole (T/H) 17 extending throughout the resin 15, a cathode connecting via 18, formed by a blind via, and an anode connecting via 19, are then formed.

This printed circuit board 10 has the aluminum sheet 11 as an anode (+) and, with interposition of the aluminum oxide layer 12, has the electrically conductive paste 14 as a cathode (−). The electrical charges are accumulated in the spacing in-between.

This printed circuit board 10 includes a through-hole 17 and a pair of copper plating sites 16, on both the front and back surfaces of the board, electrically connected to the through-hole 17, thus assuring signal interconnections across the front and back surfaces.

Meanwhile, the aluminum sheets 11A and 11B, shown in the cross-sectional view of FIG. 1, are in unison (solid) with each other. When viewed from the upper side, the planar configuration of the aluminum sheets 11A and 11B may be of any desired optional pattern, such as annular or π pattern.

Figure 2A:
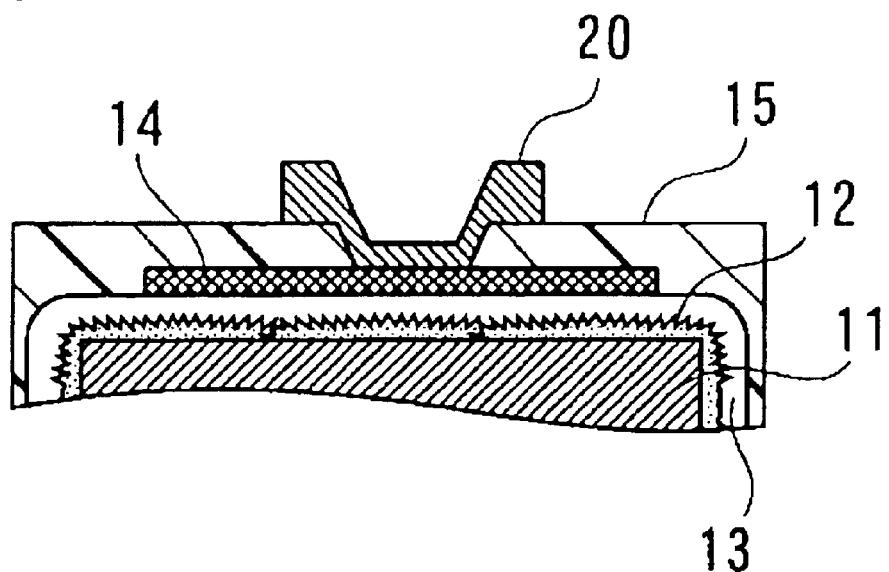
FIGS. 2A and 2B are enlarged partial views showing portions A and B in FIG. 1.
Figure 2B:
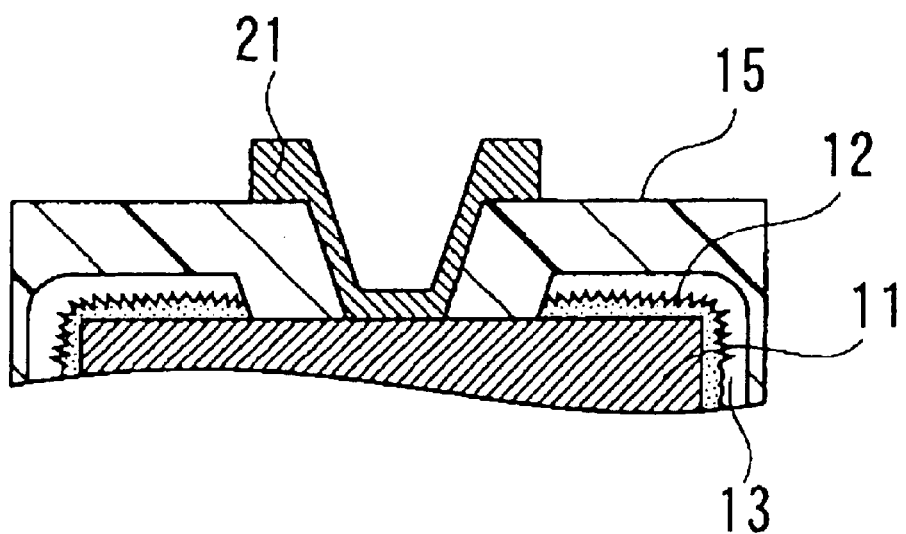

FIGS. 2A and 2B are enlarged partial cross-sectional views showing an area A, shown encircled in FIG. 1 (a cathode connection via 18 and its vicinity), and an area B (an anode connection via 19 and its vicinity), respectively.

Referring to FIG. 2A, the via for cathode connection includes an electrode 20, connected via electrically conductive paste 14 to the layer of the electrically conductive high molecular material 13, operating as a counter-electrode of the aluminum sheet 11. The aluminum oxide layer 12 is formed on the aluminum sheet 11, having the roughed surface, the layer of the electrically conductive high molecular material 13 is formed thereon, and the electrically conductive paste 14 is provided on the upper surface of the layer of the electrically conductive high molecular material 13. A hole (blind via) is bored in the encapsulating resin 15 by, for example is exposed laser irradiation, as deep as the electrically conductive paste 14 is exposed. The electrode 20 is formed by depositing an electrode material, such as copper, such as by plating.

Referring to FIG. 2B, there is formed no aluminum oxide layer nor a layer of an electrically conductive high molecular material in a via area for anode side connection for having contact with the aluminum sheet 11 on the surface of the aluminum sheet 11, but a hole (blind via) is bored in the resin 15, such as by laser irradiation, as deep as the surface of the aluminum sheet 11 is exposed, and an electrode material, such as copper, is deposited in the blind via by for example electroless plating to form the electrode 21. In depositing the electrode material, such as copper, the electrode material, such as copper, is deposited conductor patterns (not shown) and in the inside of the through-hole 17 (see FIG. 1).

Referring to FIG. 2B, showing the via for anode side connection, the resin 15 surrounding the lateral sides of the electrode 21 has its bottom in abutting contact (intimate adhesion) with the aluminum sheet 11. The electrical insulation between the anode side electrode 21 and the cathode side layer of the electrically conductive high molecular material 13 around the via for anode side connection is assured by the resin 15 introduced into the space between the electrode 21 and the layer of the electrically conductive high molecular material 13 around the via for anode side connection. By providing the aluminum oxide layer 12 and the layer of the electrically conductive high molecular material 13 up to the vicinity of the via for anode side connection, the capacitance of the capacitor may be increased, while the electrical insulation across the anode and the cathode may be secured by the resin 15.

The surface roughness of the aluminum sheet 11 is e.g., 1 to 50 μm (micrometers), i.e., above the micrometer order, while the film thickness of the aluminum oxide layer 12 is, e.g., hundreds of pm (several Angstroms) to (several) tens of nm. The film thickness of the polypyrrole film forming the layer of the electrically conductive high molecular material 13 is e.g., 10 to 50 μm. The film thickness of the double-layer electrically conductive paste 14, composed of the carbon paste and the silver paste, is e.g., 5 to 20 μm, while the film thickness of the resin 15 is, e.g., 10 to 20 μm.

With the present embodiment, described above, the aluminum oxide layer 12 can be of an extremely reduced thickness, while the electrode surface area may be increased by the roughing processing of the aluminum sheet 11, while the polypyrrole film may be coated on the roughed surface of the aluminum sheet 11 with optimum follow-up characteristics, so that the counter-electrode of the aluminum sheet 11 can be increased in the surface area to realize a high capacitance. The capacitor of high capacitance may be realized, while the through-holes traversing the substrate are formed and a desired pattern is formed on the front and back surfaces of the substrate, so that the substrate may perform the role of an interposer.

Figure 3:
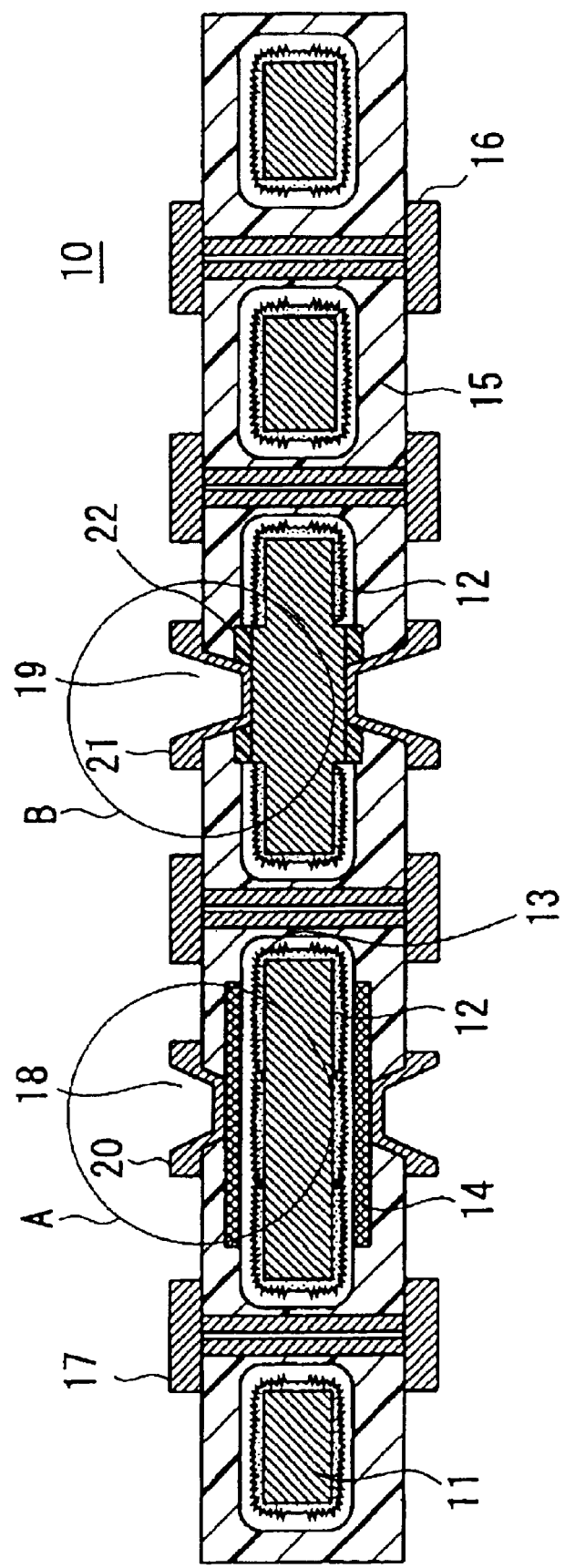
FIG. 3 is a cross-sectional view showing the structure of a second embodiment of the present invention at a typical cross section.

A second embodiment of the present invention is now explained. Referring to FIG. 3, showing the structure of the second embodiment of the present invention, an insulating resin 22 is formed in the via for anode side connection, around the site of connection to the aluminum sheet 11, to provide for electrical insulation across the electrode 21 on the anode side and the cathode side.

Figure 4A:
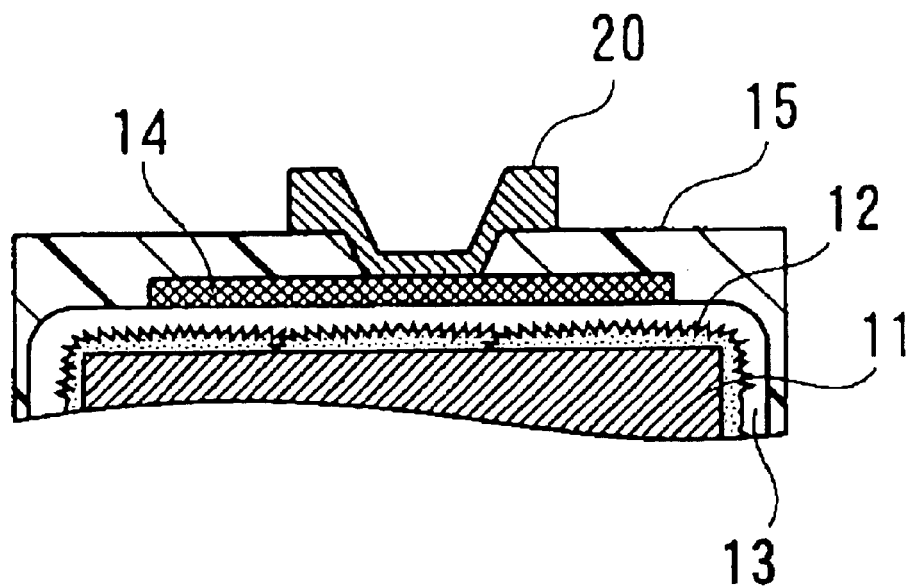
FIGS. 4A and 4B are enlarged partial views showing portions A and B in FIG. 3.
Figure 4B:
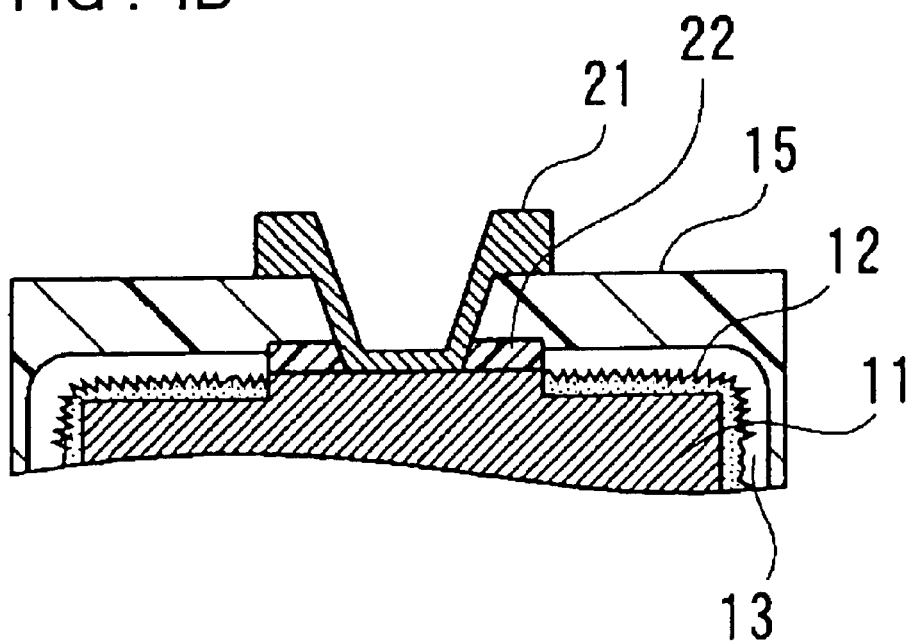

FIGS. 4A and 4B are enlarged partial cross-sectional views showing an area A shown encircled in FIG. 3 (a cathode connection via 18 and its vicinity) and an area B (an anode connection via 19 and its vicinity), to an enlarged scale, respectively. The structure of the second embodiment of the present invention differs from that of the above-described first embodiment only as to the via for anode side connection and is otherwise the same as the structure of the above-described first embodiment. That is, in the second embodiment of the present invention, the via for cathode side connection is similar in structure to that shown in FIG. 2A. In the following, the via for anode side connection, by which the second embodiment differs from the above-described first embodiment, is explained.

Referring to FIG. 4B, on an aluminum board 11 there is formed no aluminum oxide layer nor a layer of an electrically conductive high molecular material in a via area for anode side connection, and a hole (blind via) is bored by, e.g., laser irradiation through the resin 15, until reaching the surface of the aluminum sheet 11, and an electrode material, such as copper, is deposited by for example electroless plating to form the electrode 21. An insulating resin 22 is deposited for laterally surrounding the bottom of the electrode 21 on the surface of the aluminum sheet 11 so that the insulating resin has its one surface in contact with the aluminum sheet 11. The opposite side surface of the insulating resin 22 has an elevated surface at a position vertically elevated from the aluminum sheet 11 flush with or higher in level than the layer of surface the electrically conductive high molecular material 13, and abuts against the resin 15 at the upper end of the insulating resin 22. The insulating resin 22 has its inner peripheral side surrounding a portion of the lateral side of the electrode 21, while having its outer peripheral surface abutting against the layer of the electrically conductive high molecular material 13 forming the counter-electrode. The electrical insulation across the electrode on the anode side 21 and the cathode side may be maintained in this manner by the insulating resin 22 provided on the aluminum sheet 11 between the electrode 21 and the electrically conductive high molecular material 13 on the aluminum sheet 11.

That is, in the second embodiment, the electrical insulation across the anode side electrode 21 and the layer of the electrically conductive high molecular material 13 is assured by the insulating resin 22.

As this insulating resin 22, an etching resist, operating as a mask for roughing processing of the aluminum sheet 11, may also be used, as will be explained later on in connection with the explanation of the manufacturing method. The etching resist in this case is left over unchanged on the aluminum sheet 11 after the roughing processing (the etching resist is termed a [permanent resist]).

Referring to FIGS. 3 and 4B, the area of the via for anode side connection on the surface of the aluminum sheet 11, and the near-by area where the insulating resin 22 is formed, are at a higher height level than the other peripheral area where there are provided the aluminum oxide layer 12 and the layer of the electrically conductive high molecular material 13, by way of providing a stepped structure. This stepped structure is afforded by etching the aluminum sheet 11, in the course of the surface roughing process of the aluminum sheet 11, using the insulating resin 22 as a mask. The height of the step difference of the aluminum sheet 11 and the thickness of the insulating resin 22 are set so that the lateral side of the insulating resin 22 will overlie the bottom surface and the upper surface of the layer of the electrically conductive high molecular material 13. In the second embodiment, the film thicknesses of the aluminum oxide layer 12 and the layer of the electrically conductive high molecular material 13 are selected to be similar to those of the first embodiment described above. In the present second embodiment, the boring process of the via for anode side connection in the manufacture process for the printed circuit board is simplified.

A third embodiment of the present invention is now explained. FIG. 5 depicts the structure of the third embodiment of the present invention. Referring to FIG. 5, the third embodiment of the present invention is similar to the second embodiment, explained with reference to FIG. 3, except that the electrically conductive paste 14 is replaced by a metal plating layer 23. That is, in the present third embodiment, a layer of the electrically conductive high molecular material 13 of, for example, polypyrrole, is formed on the surface of the aluminum oxide layer 12, formed on the roughed surface of the aluminum sheet 11, the metal plating layer 23 is formed on the surface of the layer of the electrically conductive high molecular material 13, and a resin 15 is formed on the metal plating layer 23. The metal plating layer is formed of nickel, copper or indium. The via for anode side connection, for assuring the contact with the aluminum sheet 11, has been removed on the metal plating layer 23. In the via for anode side connection, the insulating resin 22 is provided between the electrode 21 for the anode and the ends of the layer of the electrically conductive high molecular material 13 and the metal plating layer 23 for assuring electrical insulation.

Figure 6A:
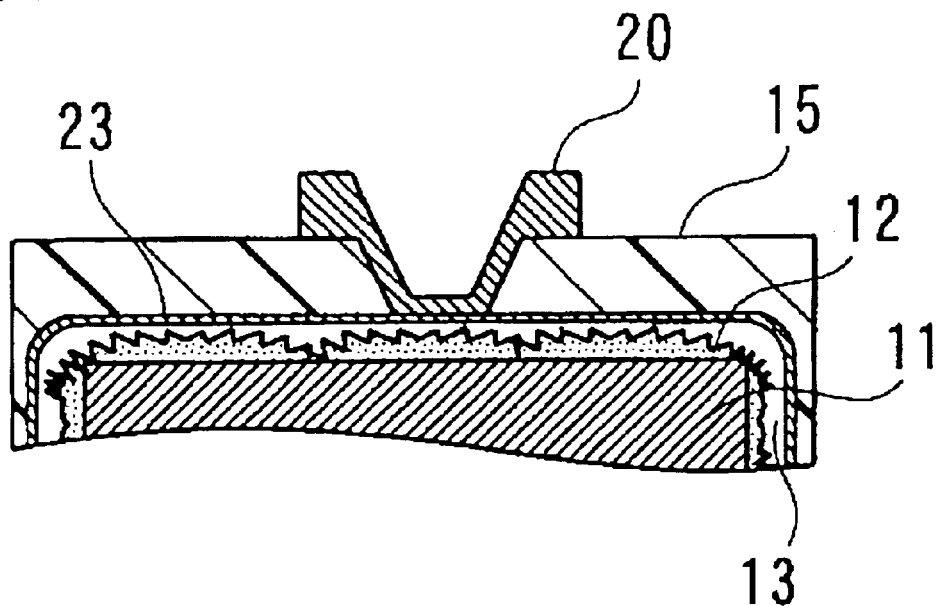
FIGS. 6A and 6B are enlarged partial views showing portions A and B in FIG. 5.
Figure 6B:
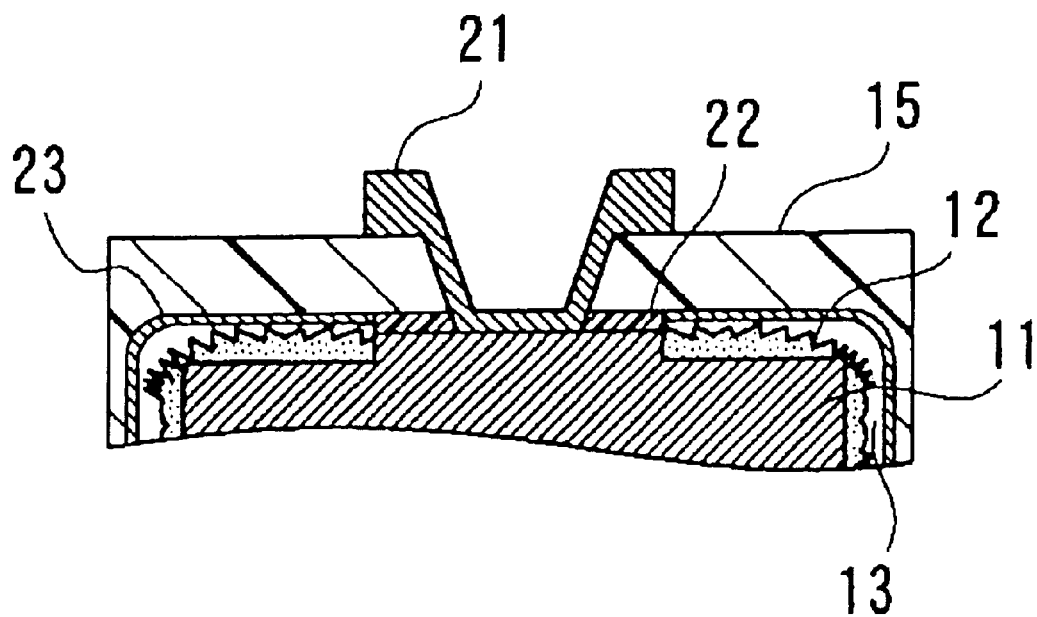

FIGS. 6A and 6B are enlarged partial cross-sectional views showing an area A shown encircled in FIG. 5 (a cathode connection via section 18 and its vicinity) and an area B (an anode connection via section 19 and its vicinity), respectively. In the following, the points of difference from the above-described first and second embodiments are explained.

Referring to FIG. 6A, the via section for cathode side connection includes an electrode 20 comprised of an electrically conducting member deposited in a via formed on boring the resin as far as the metal plating layer 23.

Referring to FIG. 6B, the via section for anode side connection is not provided with the aluminum oxide layer 12 nor with the layer of the electrically conductive high molecular material 13. The metal plating layer 23 also is removed in an area of a via forming section for anode side connection. The via section for anode side connection is provided with an electrode 21 comprised of an electrically conducting member deposited in a via formed on boring the resin 15, such as by laser working, as far as the aluminum sheet 11.

In an area of the surface of the aluminum sheet 11, surrounding the bottom of the electrode 21, there is provided an insulating resin 22, having its one surface abutting against the aluminum sheet 11. The opposite side surface of the insulating resin 22 has an upstanding position from the surface of the aluminum sheet 11 flush with or at a higher height level than the metal plating layer 23 in the vicinity of the via for anode side connection, and is abutted against the resin 15. The insulating resin 22 has its inner peripheral surface surrounding a portion of the lateral surface of the electrode 21, while having its outer peripheral surface abutting against the ends of the metal plating layer 23 and the layer of the electrically conductive high molecular material 13.

Thus, in the present third embodiment of the present invention, the electrical insulation between the electrode 21 of the anode and the cathode side by the insulating resin 22 provided between the electrode 21 on one hand and the metal plating layer 23 and the layer of the electrically conductive high molecular material 13 on the other hand is assured. That is, the electrical insulation between the anode electrode 21 on one hand and the metal plating layer 23 and the layer of the electrically conductive high molecular material 13 on the other hand is assured by the insulating resin 22.

As this insulating resin 22, an etching resist, operating as a mask for roughing processing of the aluminum sheet 11, may also be used, as will be explained later on in connection with the explanation of the manufacturing method. The etching resist in this case is left over unchanged on the aluminum sheet 11 after the roughing processing.

The area of the via for anode side connection on the surface of the aluminum sheet 11, and the near-by area where the insulating resin 22 is formed, is at a higher level than the other peripheral area where there are provided the aluminum oxide layer 12 and the layer of the electrically conductive high molecular material 13, by way of providing a stepped structure. This stepped structure is afforded by etching the aluminum sheet 11, in the course of the surface roughing process of the aluminum sheet 11, using the insulating resin 22 as a mask. It is noted that the film thicknesses of the aluminum oxide layer 12 and the layer of the electrically conductive high molecular material 13 are the same as those of the above-described first embodiment.

A fourth embodiment of the present invention is now explained. FIG. 7 depicts the structure of the fourth embodiment of the present invention FIG. 7 schematically shows the cross-section of a mounting structure in which a semiconductor device, such as CSP (chip size package), provided with the printed circuit board 10 of the aforementioned first embodiment, is mounted on a circuit substrate (motherboard) 130

In the fourth embodiment of the present invention, shown in FIG. 7, the printed circuit board 10, operating as an interposer, includes the aluminum sheet 11, as a core substrate, an aluminum oxide layer 12 and a layer of the electrically conductive high molecular material 13. The printed circuit board 10 includes, in a contact via section on the cathode side, an electrically conductive paste and an electrode 20 deposited in the via reaching the electrically conductive paste. The printed circuit board 10 also includes, on an anode side contact via 19, an electrode 21 deposited in the via reaching the aluminum sheet 11, and a layer of an encapsulating resin 15. The printed circuit board 10 is provided with a plated through-hole 17. Bumps of LSI 110 are soldered by, for example a flip chip method, to electrode pads (land of a through-hole or a via pad) provided by the face-down system on one surface of the printed circuit board 10. Solder bumps 24 are provided in a grid configuration to the opposite side surface of the printed circuit board 10. A solder resist or a mold resist is charged into a space between the printed circuit board 10 and the LSI 110 to form a CSP semiconductor device of the flip chip ball grid array (BGA) type. The electrodes 20, 21 of the connection vias 18, 19 of the cathode and the anode on one surface of the printed circuit board 10 are connected to for example a power supply terminal 112 and to a grounding terminal (bump) 111, while the land of the through-hole 17 of the printed circuit board 10 is connected to a signal terminal (bump) 113 of the LSI 110. The BGA (ball grid array) of the CSP is soldered to the circuit substrate 130. On the opposite side surface of the printed circuit board 10, electrode bumps 105 of the connection vias of the anode and the cathode are connected to a power supply pad and a ground pad of the circuit substrate (motherboard) 130. The semiconductor device, mounted on the circuit substrate 130, is sealed by an encapsulating resin 120.

The electrodes 20, 21, as contact electrodes for the capacitor enclosed in the printed circuit board 10, are connected to a near-by terminal of the LSI 110. Thus, the capacitor may be applied to a capacitor as a decoupling capacitor and a noise filter in the high speed high frequency LSI 110. Of course, the semiconductor device, provided with the printed circuit board according to the instant invention as an interposer (package substrate) is not limited to the flip chip ball grid array (BGA) type semiconductor device.

Figure 8:
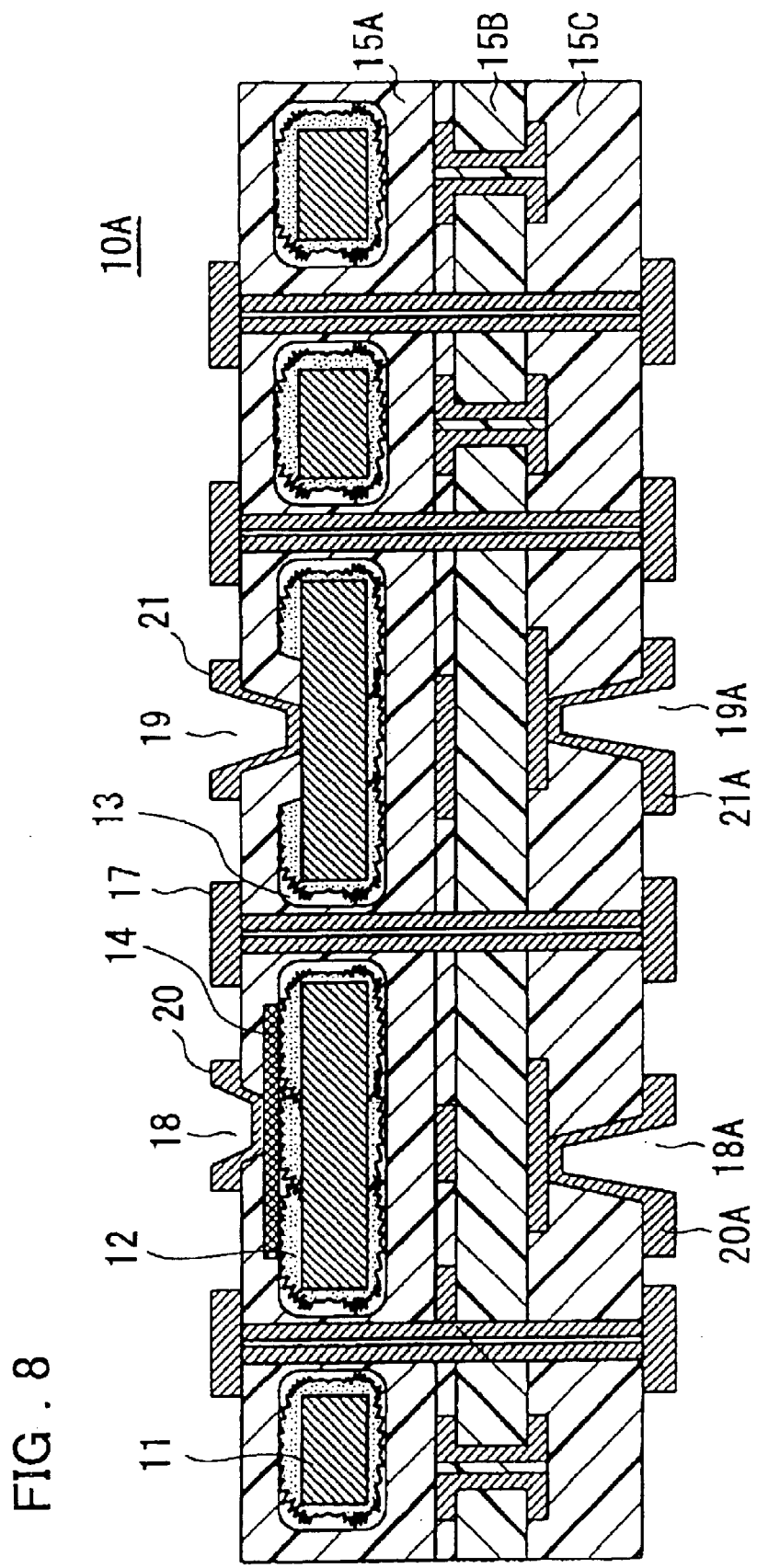
FIG. 8 is a cross-sectional view showing the structure of a fifth embodiment of the present invention.

A fifth embodiment of the present invention is now explained. FIG. 8 shows the structure of a fifth embodiment of the present invention. FIG. 8 shows the structure in which the printed circuit board of the first embodiment shown in FIG. 1 is applied to a multi-layered printed circuit board. The fifth embodiment, shown in FIG. 8, includes an aluminum sheet 11, as a core substrate, an aluminum oxide layer 12, as a dielectric film for a capacitor, and a layer of the electrically conductive high molecular material 13. The fifth embodiment also includes, in a contact via section on the cathode side, an electrically conductive paste 14, while including, on the cathode side contact via section 18, an electrode 20 reaching the electrically conductive paste 14. The anode side connection via 19 reaches the aluminum sheet 11 and is provided with an electrode 21. An interconnection layer (or layers) is(are) formed between the interlayer insulating layers 15A and 15B and between the interlayer insulating layers 15B and 15C. A cathode side connection via 18 and an anode side connection via 19 are provided as uppermost layers. On the opposite surface (back surface), there are provided a cathode side connection via 18A and an anode side connection via 19A. An electrode 20A of the cathode side connection via 18A on the back surface is connected to the electrically conductive paste 14 of the uppermost layer via a pattern of the interconnection layer and the through-hole, while the electrode 21A of the anode side connection via 19A is connected to the aluminum sheet 11 as the uppermost layer via a pattern of the interconnection layer and the through-hole. Although FIG. 8 shows three-layered interconnections, it is not limitative of the present invention.

The manufacturing method for the printed circuit board of the above-described embodiment of the present invention is now explained. FIGS. 9 to 11 schematically show the cross-section of the printed circuit board of the above-described first embodiment of the invention by way of illustrating the main manufacturing process step-by-step. It is noted that FIGS. 9 and 10 are split only for convenience in formulating the drawings.

Referring to FIG. 9A, a hole is bored at a desired location in a foil-shaped aluminum sheet 11 by e.g., drilling to form a through-hole 9.

The surface of the aluminum sheet 11 is etched for forming micro-irregularities therein. The surface roughness is on the order of e.g., 1 to 50 $\mu$m.

On the surface of the aluminum sheet 11, an aluminum oxide layer 12 is formed as a dielectric film, as shown in FIG. 9B, to a film thickness of e.g., hundreds of pm to tens of nm. The capacitance is increased by formation of an oxide film as a dielectric film on the aluminum surface the surface area of which has been increased by roughing.

A polypyrrole film, as a electrically conductive high molecular layer 13, then is formed on the aluminum oxide layer 12, to a film thickness of e.g., 10 to 50 $\mu$m, as shown in FIG. 9C.

The electrically conductive paste 14 is then formed in a location of the electrically conductive high molecular layer 13 (polypyrrole film) where the cathode contact via is to be formed, as shown in FIG. 10A. This electrically conductive paste is made up of two layers, namely a carbon paste layer and a silver paste layer. The film thickness of the electrically conductive paste 14 is e.g. 5 to 20 $\mu$m.

In a location of the electrically conductive high molecular layer 13 where an anode side connection via forming area is to be formed, boring for setting electrical connection to the aluminum sheet 11 is done by e.g., laser working, as shown in FIG. 10B. The layers of polypyrrole and aluminum oxide are then removed to expose the grounding surface of the aluminum sheet 11.

Figure 11A:
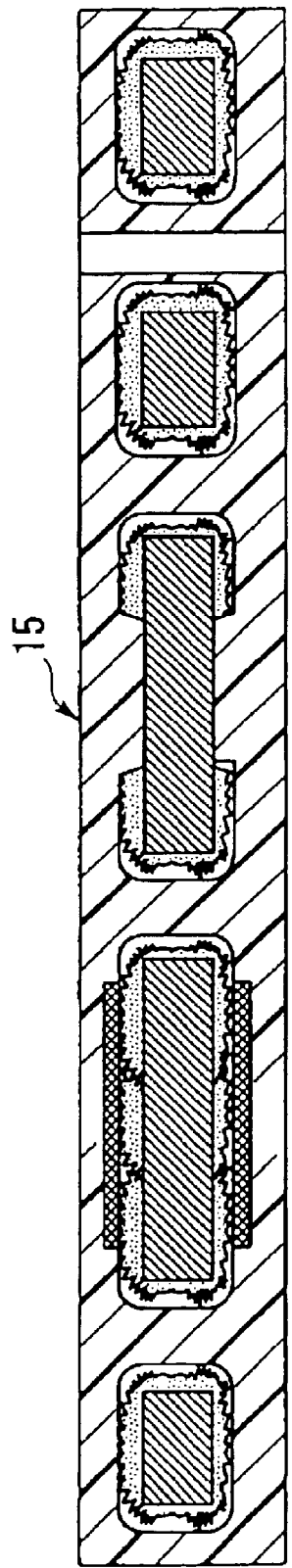
FIGS. 11A and 11B are cross-sectional views showing the manufacturing method of the first embodiment of the present invention, step-by-step.

A resin film is then bonded to each of the upper and lower surfaces, as shown in FIG. 11A, and the resin 15 is formed by vacuum laminating press. The film thickness of the resin 15 is set e.g., to 10 to 20 μm.

Figure 11B:
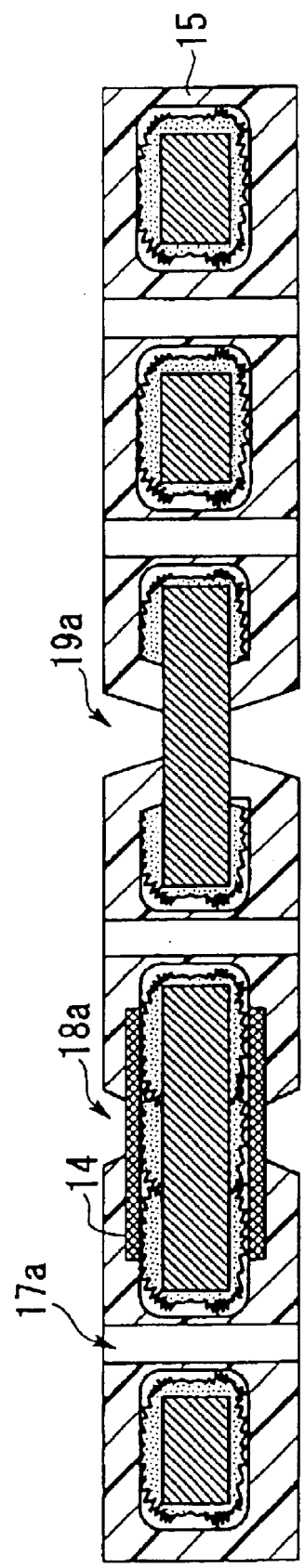

On a site of the resin 15 where a through-hole is to be formed, a pre-hole 17a for the through-hole is formed, as shown in FIG. 11B. A pre-hole 18a for connection (contact) on the cathode side and a pre-hole 19a for connection (contact) on the anode side are also formed e.g., by laser working.

In the pre-hole 18a for connection on the cathode side, the resin 15 is removed up to the upper surface of the electrically conductive paste 14 to expose the electrically conductive paste 14.

The pre-hole 19a for connection on the anode side is formed by laser working until the aluminum sheet 11 is exposed. It is noted that the diameter of the pre-hole 19a for connection on the anode side is smaller than the diameter achieved in the boring step shown in FIG. 10B.

For augmenting the plating bonding strength, the surface of the thermosetting insulating resin, such as epoxy resin, is chemically roughed, and a catalyst is applied to the surface and into the inside of the via to provide catalyst followed by formation of a plating resist, not shown. The electroless plating is then carried out to precipitate copper (16 of FIG. 1) to form a conductor pattern and a plating through-hole (17 of FIG. 1). The copper plating 16 is of a thickness of 5 to 25 μm.

The above process completes the printed circuit board shown in FIG. 1. As the through-hole plating technique, in which the patterns of interconnections on both surfaces are interconnected by through-hole plating, an additive method, for example, is used. However, this technique is merely illustrative and is not intended to limit the present invention thereto.

The manufacturing method for the printed circuit board of the above-described second embodiment of the present invention, shown in FIGS. 3 and 4, is now explained. FIGS. 12 to 14 schematically show the cross-section of the printed circuit board of the above-described second embodiment of the invention by way of illustrating the main manufacturing process step-by-step. It is noted that FIGS. 12 to 14 are split only for convenience in formulating the drawings.

Figure 12A:
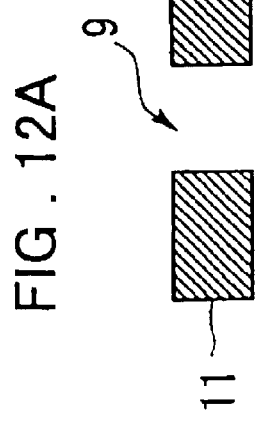
FIGS. 12A, 12B and 12C are cross-sectional views showing the manufacturing method of the second embodiment of the present invention, step-by-step.

Referring to FIG. 12A, a hole is bored at a desired location in a foil-shaped aluminum sheet 11 by e.g., drilling to form a through-hole.

Figure 12B:
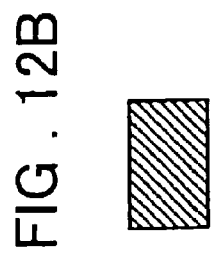

The insulating resin 22 is formed in a location of the surface of the aluminum sheet 11 where the contact to the aluminum sheet 11 is to be established, as shown in FIG. 12B. The insulating resin (resist) 22 is formed prior to surface roughing of the aluminum sheet 11. As the insulating resin 22, an epoxy resin or a polyimide resin may be used. As the insulating resin 22, a modified photosensitive epoxy resin, or a photosensitive solder resist (PSR4000 NAS-90-TY, manufactured by TAIYO INK SEIZO KK or DSR 2200 BGX-8, manufactured by TAMURA KAKEN, for example, may be used.

The surface roughing processing for the aluminum sheet 11 is then carried out, using this insulating resin 22 as a mask. This roughing processing is by etching, as an example. In this case, the surface area of the aluminum sheet 11 other than its surface coated by the insulating resin 22 is roughed to form micro-irregularities. Of course, the surface of the aluminum sheet 11 coated with the insulating resin 22 is not roughed.

Figure 12C:
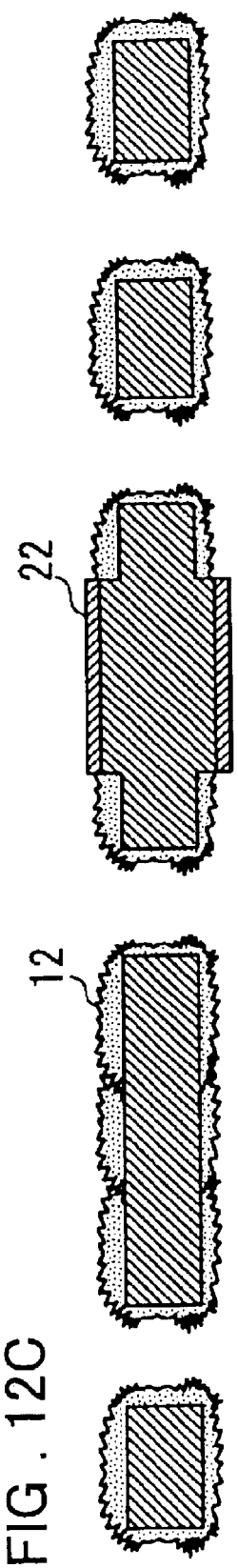

The aluminum oxide layer 12 then is formed, as a dielectric film for a capacitor, so as to follow up with the micro-irregularities of the roughed surface of the aluminum sheet 11, as shown in FIG. 12C. The film thickness of the aluminum oxide layer 12 is hundreds of pm to tens of nm. Since an oxide film forming a dielectric film has been formed on the aluminum sheet, the surface area of which has been enlarged by roughing processing, the capacitance value is increased. The aluminum oxide layer 12 is not formed on the surface area of the aluminum sheet 11 coated with the insulating resin 22.

Figure 13A:
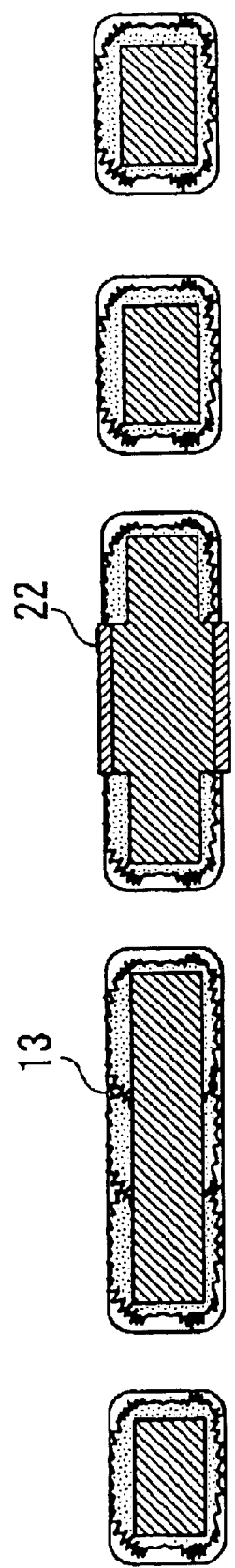
FIGS. 13A and 13B are cross-sectional views showing the manufacturing method of the second embodiment of the present invention, step-by-step.

The polypyrrole film, as a layer of the electrically conductive high molecular material (polymer) 13, is then formed on the aluminum oxide layer 12, as shown in FIG. 13A. The film thickness of the polypyrrole film is 10 to 20 μm. The polypyrrole film is not formed on the surface area of the aluminum sheet 11 coated with the insulating resin 22. The lateral surface of the insulating resin 22 abuts against the end of the polypyrrole film 13.

Figure 13B:
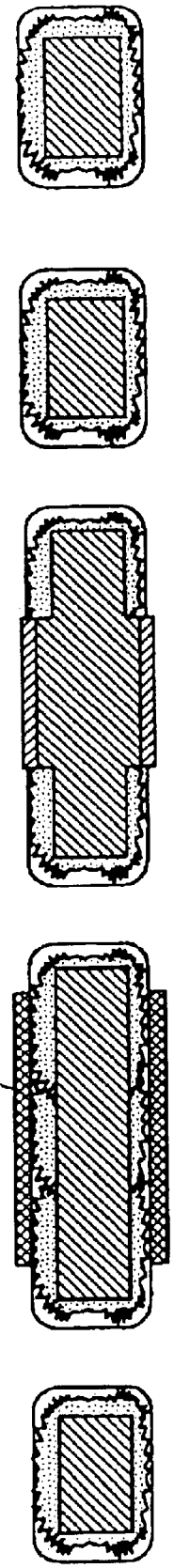

The electrically conductive paste 14 is then formed in a location of the layer of the electrically conductive high molecular material (polypyrrole film) 13 where the cathode contact via is to be formed, as shown in FIG. 13B. This electrically conductive paste is of a dual layer structure comprised of a carbon paste layer and a silver paste layer.

Figure 14A:
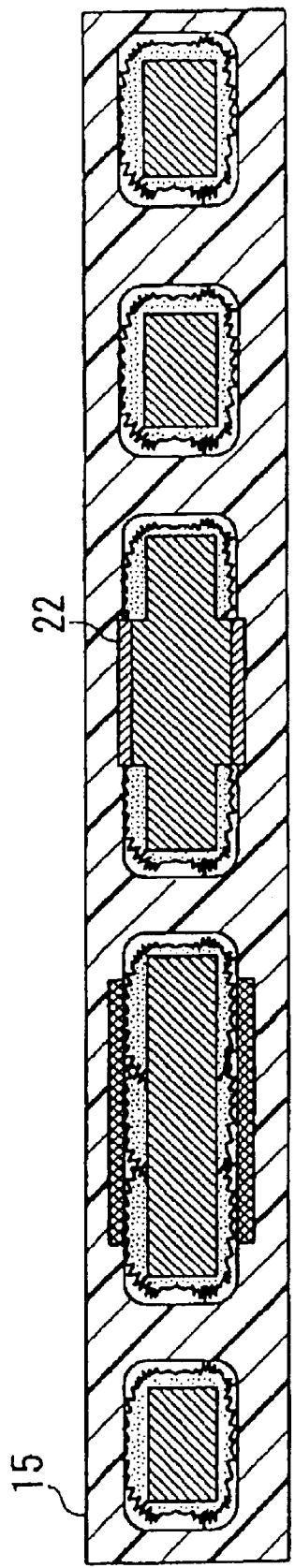
FIGS. 14A and 14B are cross-sectional views showing the manufacturing method of the second embodiment of the present invention, step-by-step.

A resin film then is bonded to each of the upper and lower surfaces, as shown in FIG. 14A, to form the resin 15 by vacuum laminated press working.

A pre-hole (basic hole) 17a for a through-hole is then formed in a location of the resin 15 where the through-hole is to be formed. Pre-hole 18a for the cathode side connection (contact) and pre-hole 19a for connection on the anode side are then formed by for example laser working.

In forming the pre-hole 18a for connection on the cathode side, the resin 15 is removed up to the upper surface of the electrically conductive paste 14 to expose the electrically conductive paste 14.

In boring the pre-hole 19a for connection on the anode side, a bore is formed in the resin 15 and in the insulating resin 22 to expose a portion of the surface of the site of the step difference of the aluminum sheet 11.

For augmenting the plating adhesion properties, the surface of the thermosetting insulating resin, such as epoxy resin, is chemically roughed, and a catalyst(s) is applied to the surface and into the inside of the via to provide catalyst followed by formation of form a plating resist, not shown. The electroless plating is then carried out to precipitate copper (16 of FIG. 3) to form a conductor pattern and a through-hole (17 of FIG. 3). The above process completes the printed circuit board shown in FIG. 3. As the through-hole plating technique, in which the patterns of interconnections on both surfaces are interconnected by through-hole plating, an additive method, for example, is used. This technique is merely illustrative and is not intended to limit the present invention thereto, as described above.

In the manufacturing method of the present embodiment, the insulating resin (resist) 22, as a mask for roughing processing, is formed in the surface area of the aluminum sheet 11 where the via for anode side connection 19 is to be formed. In the roughing processing, this surface area is not roughed, while neither the aluminum oxide layer 12 nor the layer of the electrically conductive high molecular material (polypyrrole film) 13 is formed.

Thus, in forming the via for anode side connection, only one boring operation by e.g., laser working suffices, thus simplifying the manufacture process for the preparation of the enclosed capacitor type printed circuit board.

A third embodiment of the manufacturing method for a printed circuit board according to the present invention, shown in FIGS. 5 and 6, is now explained. In the manufacturing method for the printed circuit board according to the third embodiment of the present invention, after forming the polypyrrole layer 13, as a layer of the electrically conductive high molecular material, operating as a counter-electrode, on the aluminum oxide layer 12, by the process of FIG. 13A, the metal plating layer 23 (see FIGS. 5 and 6) is formed in the process of FIG. 13B, in place of forming the electrically conductive paste layer.

Figure 14B:
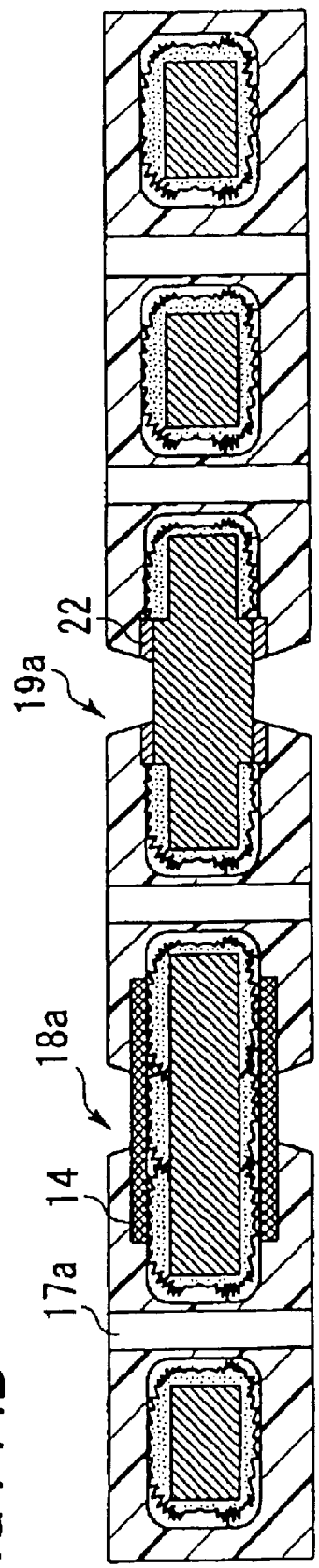

A pre-hole on the cathode side then is formed in the process step of FIG. 14B. In this case, the hole is bored by laser working until the metal plating layer 23 is exposed. In forming the pre-hole 19a for connection on the anode side, a bore is formed in the resin 15 and in the subjacent insulating resin layer 22, with the laser working until the aluminum sheet 11 is exposed. This forms a pre-hole for connection on the anode side of the structure shown in FIG. 6B (the electrode 21 of FIG. 6B has not as yet been deposited in this process step). The manufacturing process is otherwise the same as the manufacturing process for the printed circuit board of the first embodiment described above.

In the above-described manufacturing process for the printed circuit board of the present embodiment, the enclosed capacitor type printed circuit board can be produced, as the conventional process for manufacturing the printed circuit board is exploited, thereby reducing rise in the production cost to a minimum.

With the above-described manufacturing method of the present invention, a capacitor of a high capacitance value may be formed in the substrate without obstructing the laying of the interconnections of the printed circuit board.

Although the present invention has been described in the foregoing with reference to certain preferred embodiments thereof, the present invention is not limited to these particular embodiments and may comprise various changes or modifications that may occur to those ordinarily skilled in the art within the scope of the invention defined in the appended claims.

The meritorious effects of the present invention are summarized as follows.

The present invention, described above, gives rise to the following advantages:

With the printed circuit board of the present invention, the electrode surface is roughed to increase its area, the oxide film having a high dielectric constant is formed to a reduced thickness, and the electrode-to-electrode distance is diminished to realize a printed circuit board having a capacitor of a large capacitance value enclosed therein. According to the present invention, it is possible to have a capacitor of a large capacitance value enclosed in a substrate of e.g., an interposer.

Moreover, with the printed circuit board of the present invention, the electrical insulation across the anode electrode and the cathode electrode is maintained, such that a capacitor of a high capacitance value may be formed within the substrate, as the degree of freedom in designing is maintained, without inconvenience in laying the interconnections in the printed circuit board.

Additionally, with the semiconductor device of the present invention, it is possible to provide a package having enclosed therein a decoupling capacitor, a noise filter or a large capacitance capacitor array.

With the manufacturing method of the present invention, a printed circuit board of the type having an enclosed capacitor can be produced, as the conventional manufacturing process for the printed circuit board is utilized, to render it possible to suppress the manufacturing cost of the printed circuit board of the type having an enclosed capacitor.

Moreover, with the manufacturing method of the present invention, the insulating member, operating as a mask for roughing processing, is formed in an area in a metal sheet, in which to form the via for anode side connection. Since this area is not roughed, while neither the dielectric film for a capacitor nor a layer of an electrically conductive high molecular layer is formed in this area, the boring step needs to be carried out only once in forming the via for anode side connection, thereby simplifying the manufacture process for the printed circuit board of the type having an enclosed capacitor.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A printed circuit board comprising:

a metal sheet having a surface partially or totally roughed;

a dielectric film for a capacitor covering at least the roughed surface of said metal sheet;

a first electrically conductive layer covering the surface of said dielectric film for the capacitor;

a second electrically conductive layer formed on the surface of said first electrically conductive layer and electrically connected to an electrode of a first via for electrical connection to said first electrically conductive layer; and a resin layer provided for encapsulating an assembly made up by said metal sheet, dielectric film, the first electrically conductive layer and the second electrically conductive layer;

said first via for connection being formed on boring through said resin layer until reaching said second electrically conductive layer, said first via for connection including a first electrode of a conductive member deposited therein; and a second via for electrical connection to said metal sheet not being provided with said dielectric film for the capacitor, nor with said first electrically conductive layer, nor with said second electrically conductive layer, on said metal sheet in said second via for electrical connection to said metal sheet, said second via for connection extending throughout said resin layer until reaching said metal sheet; said second via for connection including a second electrode of an electrically conductive member deposited therein; said second electrode being electrically insulated from said first electrically conductive layer by an insulating member provided between said second electrode and said first electrically conductive layer.

2. The printed circuit board as defined in claim 1 wherein said dielectric film for the capacitor is formed of a film of a metal oxide.

3. The printed circuit board as defined in claim 1 wherein said first electrically conductive layer is formed of an electrically conductive resin which forms a solid electrolyte of a cathode.

4. The printed circuit board as defined in claim 1 wherein said second electrically conductive layer is of a double-layer structure comprised of a carbon paste layer and a silver paste layer.

5. The printed circuit board as defined in claim 1 wherein, in said second via for connection, said insulating member is formed of said resin encapsulating an assembly made up by said metal sheet, the dielectric film, the first electrically conductive layer and the second electrically conductive layer; and wherein said resin layer abutting on said metal sheet in a region of the surface of said metal sheet surrounding the bottom of said second electrode in said second via for connection, said resin layer covering at least a portion of the lateral surface of said second electrode operating for electrically insulating said second electrode from said first electrically conductive layer in the vicinity of said second via for connection.

6. The printed circuit board as defined in claim 1 wherein, in said second via for connection, said insulating member is formed by a member different from said encapsulating resin layer;

said insulating member has one surface abutting against said metal sheet in a region of the surface of said metal sheet surrounding said second electrode;

the surface of said insulating member opposite to said one surface abutting against said resin surrounding said second electrode;

said insulating member covering at least a portion of the lateral surface of said second electrode providing for electrical insulation between said second electrode and the region of said first electrically conductive layer lying in the vicinity of said second via for connection.

7. The printed circuit board as defined in claim 1 wherein, in said second via for connection, said insulating member comprises a member different from said resin encapsulating the assembly made up by said metal sheet, the dielectric film, the first electrically conductive layer and the second electrically conductive layer;

said insulating member has one surface abutting against said metal sheet in a region of the surface of said metal sheet surrounding said second electrode;

the surface of said insulating member opposite to said one surface abutting against said resin surrounding said second electrode;

said insulating member covering at least a portion of the lateral surface of said second electrode providing for electrical insulation between said second electrode on one hand and the region of said first and second electrically conductive layers lying in the vicinity of said second via for connection and the second electrically conductive layer on the other hand.

8. The printed circuit board as defined in claim 1 wherein said second electrically conductive layer comprises a metal plating layer covering said first electrically conductive layer.

9. A multi-layered circuit board at least one layer of which comprises the printed circuit board as defined in claim 1, an upper layer and/or a lower layer of said one layer including an insulating layer and an interconnection layer laminated in alternation with each other.

10. A semiconductor device comprising:

a semiconductor chip; and the printed circuit board as defined in claim 1; wherein said printed circuit board including a through-hole extending from one surface to the opposite side surface of said printed circuit board, said through-hole including a conductor formed on an inner wall surface thereof;

said first and second electrodes, provided in respective vias for connection on one surface of the printed circuit board, are connected to first and second power supply terminals of said semiconductor chip; signal-electrodes of said one surface of said printed circuit board being connected to associated electrodes of said semiconductor chip;

the other surface of the printed circuit board including an electrode connected to said electrodes on said one surface by said through-hole and said first and second electrodes provided in the respective vias for connection; and wherein the semiconductor device is connected to a mounting circuit board on the opposite surface of the printed circuit board.

11. The printed circuit board as defined in claim 3 wherein said first electrically conductive layer comprises at least one electrically conductive high molecular compound selected from the group consisting of polypyrrole, polythiophene and polyaniline.

12. The printed circuit board as defined in claim 6 wherein the position of said opposite surface of said insulating member in a direction normal to said metal sheet is flush with or at a higher level than a region of the surface of said first electrically conductive layer lying in the vicinity of said second via for connection.

13. The printed circuit board as defined in claim 6 wherein said insulating member is formed in a region of the surface of said metal sheet in register with said second via for connection and is a resist which becomes a mask for roughing processing of the surface of said metal sheet.

14. The printed circuit board as defined in claim 7 wherein the position of said opposite surface of said insulating member in a direction normal to said metal sheet is flush with or at a higher level than the region of the surface of said second electrically conductive layer lying in the vicinity of said second via for connection.

15. The printed circuit board as defined in claim 8 wherein said metal plating layer is a plating layer of at least one metal selected from the group consisting of nickel, copper and indium.

16. The semiconductor device as defined in claim 10 wherein said semiconductor chip is bonded by flip chip bonding to the electrode on said one surface of the printed circuit board, and wherein spherically-shaped bumps are arranged on said other surface of the printed circuit board.

17. A printed circuit board comprising:

a metal core substrate, having a surface partially or totally roughed;

a metal oxide film covering at least the roughed surface of said metal core substrate and forming a dielectric film for a capacitor;

an electrically conductive high molecular layer covering the surface of said metal oxide film to form a cathode side solid electrolyte;

an electrically conductive paste film interposed between an electrode of a via for cathode side connection and the surface of said electrically conductive high molecular layer; and an electrically insulating resin for encapsulating an assembly made up by said metal core substrate, the metal oxide film, the electrically conductive high molecular layer and the electrically conductive paste film; wherein said via for cathode side connection extending throughout said resin until reaching said electrically conductive paste film, said via for cathode side connection including a first electrode formed of a conductive member deposited therein;

said via for anode side electrical connection to said metal core substrate is freed of said metal oxide film and said electrically conductive high molecular layer and is not provided with said electrically conductive paste film, said via for anode side connection extending throughout said resin until reaching said metal core substrate, said via for anode side connection including a second electrode of an electrically conductive member deposited therein; and wherein in said via for anode side connection, the bottom of said resin surrounding said second electrode abutting against said metal core substrate; said resin charged into a space between said second electrode and said electrically conductive high molecular layer in the vicinity of said via for anode side connection providing for electrical insulation between said second electrode and the portion of said electrically conductive high molecular layer lying in the vicinity of said via for anode side connection.

18. The printed circuit board as defined in claim 17 wherein said insulating member comprises a resist formed in a region of the surface of said metal sheet in which said via for anode side connection is to be formed, said resist serving as a mask in the roughing processing for said metal sheet; and wherein the region of the metal core substrate in which said resist has been formed is of a height different than in a near-by region where said metal oxide film and said electrically conductive high molecular layer are formed.

19. The printed circuit board as defined in claim 17 wherein said electrically conductive high molecular layer is at least one electrically conductive high molecular compound selected from the group consisting of polypyrrole, polythiophene and polyaniline.

20. The printed circuit board as defined in claim 17 wherein said second electrically conductive paste film is of a double-layer structure comprised of a carbon paste layer and a silver paste layer.

21. The printed circuit board as defined in claim 17 wherein said metal core substrate is formed of aluminum, with said metal oxide film being a film of aluminum oxide.

22. The printed circuit board as defined in claim 17 wherein said metal oxide film has a thickness in a range from hundreds of pm (picometers) to tens of nm (nanometers), and said electrically conductive high molecular layer has a thickness in a range from 1 to 50 $\mu$m.

23. A printed circuit board comprising:

a metal core substrate, having a surface partially or totally roughed;

a metal oxide film covering at least the roughed surface of said metal core substrate and forming a dielectric film for a capacitor;

an electrically conductive high molecular layer covering the surface of said metal oxide film to form a cathode side solid electrolyte;

an electrically conductive paste film interposed between an electrode of a via for cathode side connection and the surface of said electrically conductive high molecular layer; and an electrically insulating resin for encapsulating an assembly made up by said metal core substrate, the metal oxide film, the electrically conductive high molecular layer and the electrically conductive paste film; wherein said via for cathode side connection extending throughout said resin until reaching said electrically conductive paste film, said via for cathode side connection including a first electrode of a conductive member deposited therein;

said via for anode side electrical connection to said metal core substrate is not provided with said metal oxide film, nor with the electrically conductive high molecular layer, nor with the electrically conductive paste film, said via for anode side connection extending throughout said resin until reaching said metal core substrate, said via for anode side connection including a second electrode of an electrically conductive member deposited therein;

said via for anode side connection includes an insulating member having one surface abutting against said metal core substrate in a region of the surface of said metal sheet surrounding said second electrode;

the position of the other surface of said insulating member opposite to said one surface in a direction normal to the surface of said metal core sheet is flush with or at a higher level than the surface of said electrically conductive high molecular layer in the vicinity of said via for anode side connection, said opposite other surface of said insulating member abutting against said resin surrounding said second electrode; and wherein the portion of said insulating member covering at least a portion of the lateral surface of said second electrode provides for electrical insulation between said second electrode and said electrically conductive high molecular layer in the vicinity of said via for anode side connection.

24. A printed circuit board comprising:

a metal core substrate, having a surface partially or totally roughed;

a metal oxide film covering at least the roughed surface of said metal core substrate and forming a dielectric film for a capacitor;

an electrically conductive high molecular layer covering the surface of said metal oxide film and forming a cathode side solid electrolyte;

a metal plating layer covering the surface of said electrically conductive high molecular layer; and an insulating resin for encapsulating an assembly made up by said metal core substrate, the metal oxide film, the electrically conductive high molecular layer and said metal plating layer; wherein said via for cathode side connection is formed in a bore extending through said resin until reaching said metal plating layer, said via for cathode side connection including a first electrode of an electrically conductive material deposited therein;

said via for anode side electrical connection to said metal core substrate is not provided with said metal oxide film, nor with the electrically conductive high molecular layer, nor with the electrically conductive paste film, said via for anode side connection being formed by boring through said resin until reaching the metal core substrate, said via for anode side connection including a second electrode of an electrically conductive member deposited therein;

said via for anode side connection includes an insulating member having one surface abutting against said metal core substrate in a region of the surface of said metal sheet surrounding said second electrode;

the position of the other surface of said insulating member opposite to said one surface in an upstanding direction relative to the surface of said metal sheet is flush with or at a higher level than the surface of said metal plating layer in the vicinity of said via for anode side connection, said opposite other surface of said insulating member abutting against said resin surrounding said second electrode; and wherein the portion of said insulating member covering at least a portion of the lateral surface of said second electrode provides for electrical insulation between said second electrode on one hand and said electrically conductive high molecular layer in the vicinity of said via for anode side connection and the metal plating layer on the other hand.

25. The printed circuit board as defined in claim 24 wherein said insulating member comprises a resist formed in a region of the surface of said metal sheet in which said via for anode side connection is to be formed, said resist serving as a mask in the roughing processing for said metal sheet; and wherein the region of the metal core substrate in which said resist has been formed has a height different than in a near-by region where said metal oxide film, said electrically conductive high molecular layer and the metal plating layer are formed.

26. The printed circuit board as defined in claim 24 wherein said metal plating layer is a plating layer of at least one metal selected from the group consisting of nickel, copper and indium.

27. A method for producing a printed circuit board comprising:

a step of roughing the surface of a metal sheet adapted to be a core substrate;

a step of forming a dielectric film for a capacitor on at least the roughed surface of said metal sheet;

a step of forming a first electrically conductive layer on said dielectric film for the capacitor;

a step of forming a second electrically conductive layer in an area on the surface of said first electrically conductive layer in register with an area in which a first via for electrical connection to said first electrically conductive layer is to be formed;

a step of boring a hole through said first electrically conductive layer and said dielectric film for the capacitor in an area in which a second via for electrical connection to said metal sheet is to be formed, to remove said first electrically conductive layer and the dielectric film for the capacitor to expose said metal sheet;

a step of encapsulating an assembly including said metal sheet, said first electrically conductive layer, said dielectric film for the capacitor and the second electrically conductive layer, formed by the respective steps, with an electrically insulating resin;

a step of boring through said resin for forming said first via for connection to expose said second electrically conductive layer, and boring through said resin for forming said second via for connection to expose said metal sheet; and a step of depositing an electrically conductive material in a conductor pattern including said vias.

28. The method for producing a printed circuit board as defined in claim 27 wherein said dielectric film for the capacitor is formed by a film of an oxide of a metal of said metal sheet.

29. The method for producing a printed circuit board as defined in claim 27 wherein said first electrically conductive layer is formed of an electrically conductive resin as a solid electrolyte material of a cathode.

30. The printed circuit board as defined in claim 27 wherein said second electrically conductive layer is of a double-layer structure comprised of a carbon paste layer and a silver paste layer.

31. The printed circuit board as defined in claim 27 wherein said dielectric film for capacitor has a thickness in a range from hundreds of pm (picometers) to tens of nm (nanometers).

32. The printed circuit board as defined in claim 27 wherein said first electrically conductive layer has a thickness in a range from 1 to 50 $\mu$m (micrometers).

33. The method for producing a printed circuit board as defined in claim 29 wherein said electrically conductive resin is at least one electrically conductive high molecular compound selected from the group consisting of polypyrrole, polythiophene and polyaniline.

34. A method for producing a printed circuit board comprising:

a step of forming an insulating member in a partial area on the surface of a metal sheet, as a core substrate, where electrical connection to said metal sheet is to be established;

a step of roughing the surface of said metal sheet as said partial area of said metal sheet is to be covered by said insulating member;

a step of forming a dielectric film for a capacitor on the roughed surface of said metal sheet, except the area thereof covered by said insulating member, leaving said insulating member on said metal sheet;

a step of forming a first electrically conductive layer on said dielectric film for the capacitor leaving said insulating member on said metal sheet;

a step of forming a second electrically conductive layer in an area of the surface of said first electrically conductive layer in which a first via for electrical connection to said first electrically conductive layer is to be formed, leaving said insulating member on said metal sheet;

a step of encapsulating an assembly including said metal sheet, said first electrically conductive layer, said dielectric layer for the capacitor and the second electrically conductive layer by said insulating member, formed by the respective steps, with an electrically insulating member;

a step of boring through said resin to form said first via for connection to expose said second electrically conductive layer and boring through said resin and said insulating member to form said second via for electrical connection to said metal sheet, to expose a portion of the surface of said metal sheet; and a step of depositing an electrically conductive material in a conductor pattern including said vias.

35. The printed circuit board as defined in claim 34 wherein the upper surface of said insulating member has a height, in a direction normal to said metal sheet, that is flush with or at a higher level than the region of said first electrically conductive layer in the vicinity of said insulating member.

36. The printed circuit board as defined in claim 34 wherein said insulating member is a resist working as a mask in the roughing processing for the surface of said metal sheet.

37. The printed circuit board as defined in claim 35 wherein a step difference is provided in said metal sheet so that a region thereof provided with said insulating member is at a higher level than a near-by region where said dielectric film for the capacitor and the first electrically conductive layer are provided.

38. A method for producing a printed circuit board comprising:

- a step of forming an insulating member in a partial area on the surface of a metal sheet, as a core substrate, where electrical connection to said metal sheet is to be established;
- a step of roughing the surface of said metal sheet under covering said partial area of said metal sheet by said insulating member;
- a step of forming a dielectric film for a capacitor on the roughed surface of said metal sheet except the area thereof covered by said insulating member, leaving said insulating member on said metal sheet;
- a step of forming a first electrically conductive layer on said dielectric film for the capacitor, leaving said insulating member on said metal sheet;
- a step of forming a second electrically conductive layer overlying said first electrically conductive layer, leaving said insulating member on said metal sheet;
- a step of encapsulating an assembly including said metal member, said first electrically conductive layer and said dielectric layer for the capacitor, the second electrically conductive layer and said insulating member, formed by the respective steps, with an electrically insulating resin;
- a step of boring through said resin to form said first via for connection to expose said second electrically conductive layer, and boring through said resin and said insulating member to form said second via for electrical connection to said metal sheet, to expose a portion of the surface of said metal sheet; and
- a step of depositing an electrically conductive material in a conductor pattern including said vias.

39. The printed circuit board as defined in claim 38 wherein said second electrically conductive layer comprises a metal plating layer formed for covering said first electrically conductive layer.

40. The printed circuit board as defined in claim 38 wherein the upper surface of said insulating member has a height, in a direction normal to the surface of said metal sheet, that is flush with or at a higher level than the region of said second electrically conductive layer in the vicinity of said insulating member.

41. The printed circuit board as defined in claim 39 wherein said metal plating layer comprises a plating layer of at least one metal selected from the group consisting of nickel, copper and indium.

42. The printed circuit board as defined in claim 40 wherein a step difference is provided in said metal sheet so that a region thereof provided with said insulating member is at a higher level than a near-by region where said dielectric film for the capacitor, the first electrically conductive layer and the second electrically conductive layer are provided.

* * * * *